(12) United States Patent
Lee et al.

(10) Patent No.: US 12,490,489 B2
(45) Date of Patent: Dec. 2, 2025

(54) SEMICONDUCTOR DEVICES HAVING SPACER STRUCTURES

(71) Applicant: SAMSUNG ELECTRONICS CO., LTD., Suwon-si (KR)

(72) Inventors: Jeonil Lee, Suwon-si (KR); Gyuhyun Kil, Hwaseong-si (KR); Doosan Back, Seoul (KR); Chansic Yoon, Anyang-si (KR); Junghoon Han, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 428 days.

(21) Appl. No.: 18/072,784

(22) Filed: Dec. 1, 2022

(65) Prior Publication Data
US 2023/0178634 A1 Jun. 8, 2023

(30) Foreign Application Priority Data
Dec. 3, 2021 (KR) .................. 10-2021-0171760

(51) Int. Cl.
H10D 64/01 (2025.01)
H10B 12/00 (2023.01)
H10D 30/01 (2025.01)
H10D 30/60 (2025.01)
H10D 64/27 (2025.01)

(52) U.S. Cl.
CPC ........... *H10D 64/021* (2025.01); *H10B 12/09* (2023.02); *H10B 12/50* (2023.02); *H10D 30/0227* (2025.01); *H10D 30/601* (2025.01); *H10D 64/514* (2025.01); *H10B 12/315* (2023.02); *H10B 12/34* (2023.02); *H10B 12/482* (2023.02)

(58) Field of Classification Search
CPC . H10D 64/021; H10D 30/0227; H10D 30/601
See application file for complete search history.

(56) References Cited

U.S. PATENT DOCUMENTS

| 7,732,280 | B2 | 6/2010 | Kang et al. |
| 9,312,189 | B2 | 4/2016 | Zaka et al. |
| 9,355,848 | B2 | 5/2016 | Chen et al. |
| 9,449,883 | B2 | 9/2016 | Kato et al. |
| 9,786,785 | B2 * | 10/2017 | Kim .................. H10D 30/60 |
| 10,644,130 | B2 | 5/2020 | Yang et al. |
| 10,896,967 | B2 | 1/2021 | Yoon et al. |

(Continued)

FOREIGN PATENT DOCUMENTS

| JP | 2003078131 A | 3/2003 |
| KR | 10-0707590 B1 | 4/2007 |
| KR | 1020170001274 A | 1/2017 |

Primary Examiner — Tuan A Hoang
(74) Attorney, Agent, or Firm — Muir Patent Law, PLLC

(57) ABSTRACT

A semiconductor device includes a substrate, a gate dielectric layer on the substrate, the gate dielectric layer including a recess at a side surface thereof, a gate electrode structure on the gate dielectric layer, a gate capping layer on the gate electrode structure, and a spacer structure on the substrate and covering side surfaces of the gate dielectric layer, the gate electrode structure, and the gate capping layer, the spacer structure including a first spacer, a second spacer on the first spacer and covering the recess, and a third spacer on the second spacer, the second spacer and the third spacer including silicon nitride.

20 Claims, 19 Drawing Sheets

(56) References Cited

U.S. PATENT DOCUMENTS

2002/0187646 A1   12/2002  Curello
2006/0205148 A1    9/2006  Deppe et al.
2018/0219018 A1*  8/2018  Wu ........................ H10D 30/69
2020/0091305 A1*  3/2020  Yoon .................. H10D 30/0278

* cited by examiner

SEMICONDUCTOR DEVICES HAVING SPACER STRUCTURES

CROSS-REFERENCE TO THE RELATED APPLICATION

This application claims priority from Korean Patent Application No. 10-2021-0171760, filed on Dec. 3, 2021, in the Korean Intellectual Property Office, the disclosure of which is incorporated herein by reference in its entirety.

BACKGROUND

1. Field

The exemplary embodiments of the disclosure relate to a semiconductor device having a spacer structure.

2. Description of the Related Art

In accordance with a demand for high integration and miniaturization of a semiconductor device, such a semiconductor device is being scaled down in size. Accordingly, a semiconductor memory device used in an electronic appliance also requires high integration and, as such, design rules for constituent elements of the semiconductor memory device are reduced. Technology for reducing the size of a semiconductor device while enhancing reliability of the semiconductor device is needed.

SUMMARY

A semiconductor device according to exemplary embodiments of the disclosure may include a gate dielectric layer disposed on a substrate, the gate dielectric layer including a recess at a side surface thereof, a gate electrode structure on the gate dielectric layer, a gate capping layer on the gate electrode structure, and a spacer structure disposed on the substrate and disposed at side surfaces of the gate dielectric layer, the gate electrode structure and the gate capping layer, the spacer structure including a first spacer, a second spacer disposed outside the first spacer, and a third spacer disposed outside the second spacer. The second spacer may cover the recess. The second spacer and the third spacer may include silicon nitride.

A semiconductor device according to exemplary embodiments of the disclosure may include a substrate including a cell area having a first active region, and a peripheral circuit area having a second active region, a word line structure disposed in the substrate in the cell area and extending in a first horizontal direction, a bit line structure extending in a second horizontal direction intersecting the first horizontal direction and crossing the word line structure, a capacitor structure electrically connected to the first active region, the capacitor structure including a lower electrode, a capacitor dielectric layer on the lower electrode, and an upper electrode on the capacitor dielectric layer, and a gate structure disposed on the second active region in the peripheral circuit area. The gate structure may include a gate dielectric layer disposed on the substrate, the gate dielectric layer including a recess at a side surface thereof, a gate electrode structure on the gate dielectric layer, a gate capping layer on the gate electrode structure, and a spacer structure disposed on the substrate and disposed at side surfaces of the gate dielectric layer, the gate electrode structure and the gate capping layer, the spacer structure including a first spacer, a second spacer disposed outside the first spacer, and a third spacer disposed outside the second spacer. The second spacer may cover the recess. The second spacer and the third spacer may include silicon nitride.

A semiconductor device according to exemplary embodiments of the disclosure may include a substrate including an active region and a source/drain region, a gate dielectric layer including a first dielectric layer disposed on the substrate, and a second dielectric layer on the first dielectric layer, the first dielectric layer including a recess at a side surface thereof, a gate electrode structure on the gate dielectric layer, a gate capping layer on the gate electrode structure, a spacer structure disposed on the substrate and disposed at side surfaces of the gate dielectric layer, the gate electrode structure and the gate capping layer, the spacer structure including a first spacer, a second spacer disposed outside the first spacer, a third spacer disposed outside the second spacer, and a fourth spacer covering the third spacer, an etch stop layer covering the gate capping layer and the spacer structure, an interlayer insulating layer covering the etch stop layer, and a source/drain contact contacting the source/drain region and extending through the interlayer insulating layer. The second spacer may cover the recess. The second spacer and the third spacer may include silicon nitride.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
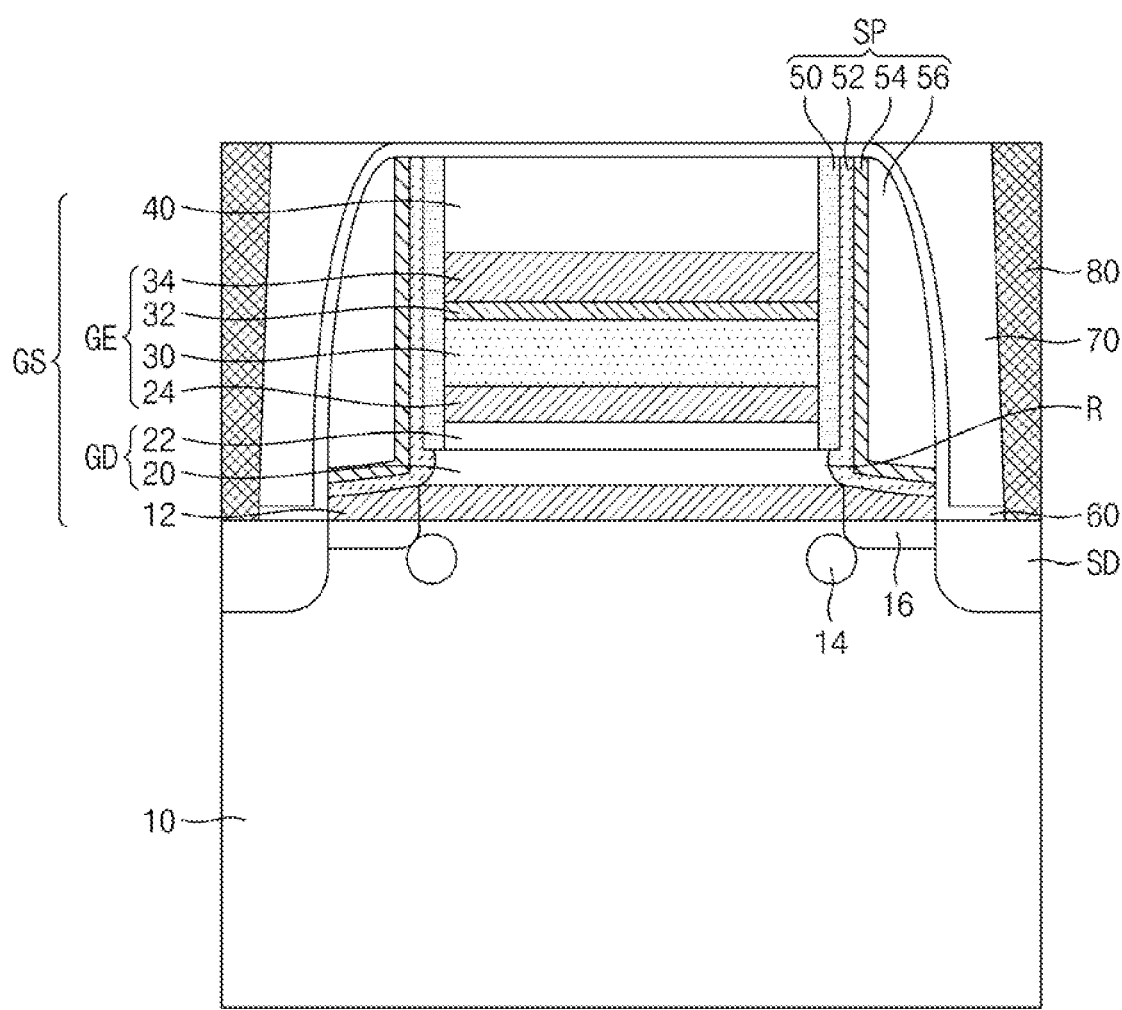
FIG. 1 is a vertical cross-sectional view of a semiconductor device according to an exemplary embodiment.
Figure 2:
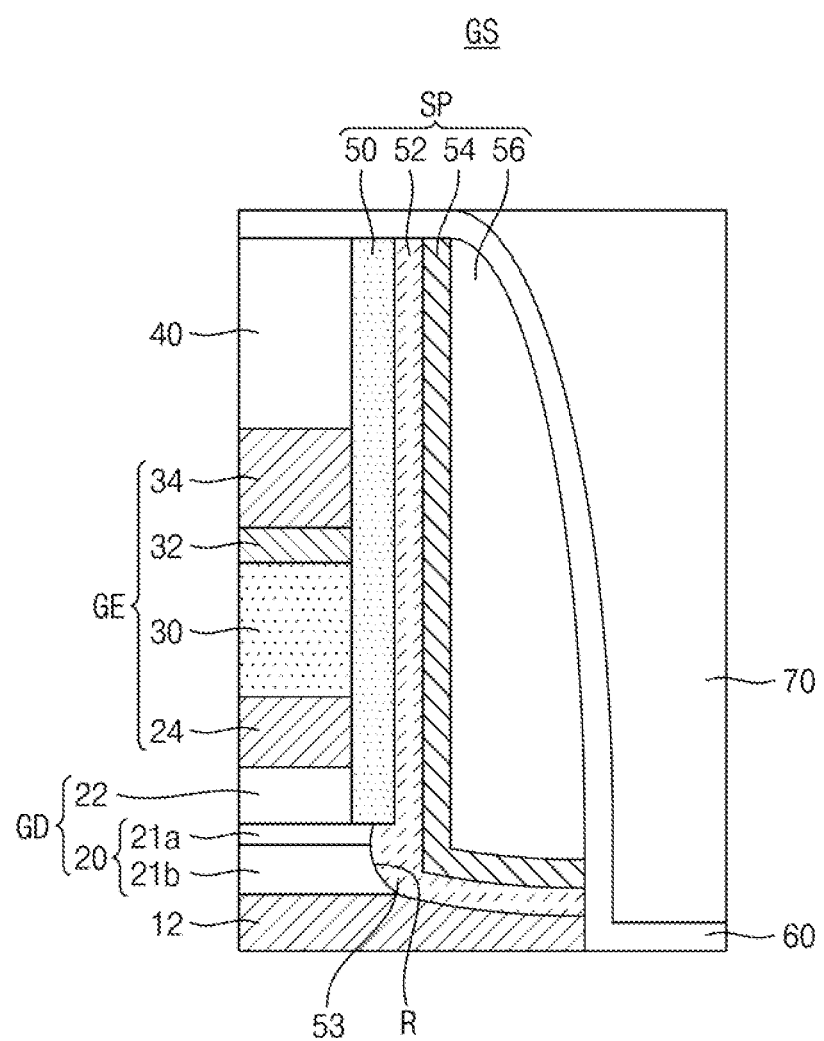
FIG. 2 is an enlarged view of the semiconductor device shown in FIG. 1.

FIG. 1 is a vertical cross-sectional view of a semiconductor device according to an exemplary embodiment. FIG. 2 is an enlarged view of the semiconductor device shown in FIG. 1.

Referring to FIGS. 1 and 2, a semiconductor device according to an exemplary embodiment may include a semiconductor layer 12, a gate structure GS, an etch stop layer 60, an interlayer insulating layer 70, and a source/drain contact 80 on a substrate 10. The substrate 10 may include an active region AR (FIG. 3), a halo region 14, an LDD region 16, and a source/drain region SD.

The active region AR may include an impurity. When an NMOS transistor is to be formed, the active region AR may be P type, whereas, when a PMOS transistor is to be formed, the active region AR may be N type.

The semiconductor layer 12 may be partially disposed at an upper surface of the substrate 10, and may include, e.g., SiGe. For example, the semiconductor layer 12 may be disposed between the substrate 10 and the gate structure GS.

The halo region 14 and the LDD region 16 may be disposed at an upper portion of the substrate 10. For example, the LDD region 16 may be disposed at an upper portion of the active region AR while being adjacent to the gate structure GS, and the halo region 14 may be disposed to, e.g., directly, contact a lower portion of the LDD region 16. The source/drain region SD may be disposed outside the LDD region 16. The halo region 14 may include an impurity having the same conductivity type as the active region AR. The LDD region 16 may include an impurity having a conductivity type different from that of the active region AR. The source/drain region SD may have the same conductivity type as the LDD region 16, and may have a higher ion concentration than the LDD region 16.

Further, as illustrated in FIG. 1, the gate structure GS may be disposed on the substrate 10, e.g., on the semiconductor layer 12. The gate structure GS may include a gate dielectric layer GD, a gate electrode structure GE, a gate capping layer 40, and a spacer structure SP.

In detail, referring to FIG. 2, the gate dielectric layer GD may include a first dielectric layer 20 on the semiconductor layer 12, and a second dielectric layer 22 on the first dielectric layer 20. The first dielectric layer 20 may include an upper dielectric layer 21a and a lower dielectric layer 21b including silicon oxide. The thickness of the lower dielectric layer 21b may be greater than the thickness of the upper dielectric layer 21a, e.g., along a vertical direction that is along a normal direction to a bottom surface of the substrate 10. The upper dielectric layer 21a may be adapted to enhance interface characteristics between the lower dielectric layer 21b and the second dielectric layer 22, e.g., and may be omitted.

The first dielectric layer 20 may include a recess R at a side surface thereof, e.g., at a lateral surface of the first dielectric layer 20 facing the interlayer insulating layer 70. For example, the side surface of the first dielectric layer 20 may be concave, e.g., with respect to the first dielectric layer 20, and may be rounded. The side surface of the first dielectric layer 20 may be misaligned from side surfaces of the second dielectric layer 22, the gate electrode structure GE, and the gate capping layer 40. For example, the horizontal length of the first dielectric layer 20 may be greater than the horizontal lengths of the gate electrode structure GE and the gate capping layer 40, e.g., the first dielectric layer 20 may extend horizontally (e.g., along a direction parallel to the bottom surface of the substrate 10) beyond the gate electrode structure GE and the gate capping layer 40.

The second dielectric layer 22 may include a dielectric material having a higher dielectric constant than the first dielectric layer 20. For example, the second dielectric layer 22 may include a high dielectric material, e.g., $HfO_2$. For example, as illustrated in FIG. 2, the side surface of the second dielectric layer 22 may be level, e.g., coplanar, with side surfaces of the gate electrode structure GE and the gate capping layer 40

The gate electrode structure GE may include a work function control layer 24, a first gate conductive layer 30, a second gate conductive layer 32, and a third gate conductive layer 34 which are sequentially stacked, e.g., directly, on the second dielectric layer 22. The work function control layer 24 may include, e.g., metal, a conductive metal nitride, a conductive metal carbide, a conductor including metal atoms, or a combination thereof. In an embodiment, the first gate conductive layer 30 may include, e.g., doped polysilicon, and the second gate conductive layer 32 and the third gate conductive layer 34 may include, e.g., a combination of metal and metal nitride. The gate capping layer 40 may be disposed, e.g., directly, on the gate electrode structure GE, and may include, e.g., silicon nitride.

The spacer structure SP may be disposed on the semiconductor layer 12, and may cover a side surface of the gate dielectric layer GD and the side surfaces of the gate electrode structure GE and the gate capping layer 40. For example, in a cross-sectional view, spacer structures SP may be disposed at opposite side surfaces of the gate electric layer GD, the gate electrode structure GE, and the gate capping layer 40. For example, at least a portion of a side surface of the spacer structure SP may be coplanar with a side surface of the semiconductor layer 12. The spacer structures SP may include a first spacer 50, a second spacer 52, a third spacer 54, and a fourth spacer 56.

The first spacer 50 may, e.g., continuously and directly, cover the side surfaces of the second dielectric layer 22, the gate electrode structure GE, and the gate capping layer 40, and may have a line shape extending in the vertical direction. An upper surface of the first spacer 50 may be coplanar with an upper surface of the gate capping layer 40, and a lower surface of the first spacer 50 may be disposed at a higher level than a lower surface of the gate electric layer GD, e.g., relative to the bottom surface of the substrate 10. For example, the lower surface of the first spacer 50 may, e.g., directly, contact an upper surface of the first dielectric layer 20, and may be disposed at the same level as the upper surface of the first dielectric layer 20, e.g., the lower surface of the first spacer 50 may be coplanar with the lower surface of the second dielectric layer 22.

The second spacer 52 may be disposed outside the first spacer 50, e.g., the first spacer 50 may be between the second spacer 52 and each of the gate capping layer 40 and the gate electrode structure GE. Here, "disposed outside" means "disposed to be spaced apart from a center of the gate structure GS or the gate electrode structure GE by a greater distance." For example, the second spacer 52 may, e.g., continuously and directly, cover a side surface of the first spacer 50 and an upper surface of the semiconductor layer 12, and may have an L shape. The second spacer 52 may also cover, e.g., completely fill, the recess R of the first dielectric layer 20. For example, the second spacer 52 may include a protrusion 53 contacting the upper surface of the semiconductor layer 12 while protruding toward the first dielectric layer 20, and the protrusion 53 may cover the recess R, e.g., the protrusion 53 may be below the first spacer 50. The thickness of the second spacer 52 in the vicinity of the protrusion 53 may be greater than the thickness of the second spacer 52 above and below the protrusion 53.

For example, the second spacer 52 may include the protrusion 53, a first portion extending vertically from the protrusion 53 along the first spacer 50, and a second portion extending horizontally from the protrusion 53 along the semiconductor layer 12. For example, as illustrated in FIG. 2, the first portion of the second spacer 52 may be a linear portion with a constant thickness measured from the first spacer 50 to the third spacer 54, and the second portion of the second spacer may be a linear portion with a constant thickness measured from the semiconductor layer 12 to the third spacer 54. The thickness of the protrusion 53, e.g., measured from the first dielectric layer 20 to the third spacer 54, may be greater than the thickness of each of the first portion and the second portion of the second spacer 52. The protrusion 53 may contact the first dielectric layer 20, e.g., may directly contact side surfaces of the upper dielectric layer 21a and the lower dielectric layer 21b.

An upper surface of the second spacer 52 may be coplanar with the upper surface of the gate capping layer 40. A lower surface of the second spacer 52 may be disposed at a lower level than a lower surface of the gate dielectric layer GD, e.g., relative to the bottom surface of the substrate 10, and may, e.g., directly, contact the upper surface of the semiconductor layer 12.

The third spacer 54 may be disposed outside the second spacer 52, e.g., the second spacer 52 may be between the first spacer 50 and the third spacer 54. For example, the third spacer 54 may, e.g., directly and continuously, cover the second spacer 52, and may have an L shape (in a cross-sectional view). An uppermost surface of the third spacer 54 may be coplanar with the upper surface of the gate capping layer 40. A lowermost surface of the third spacer 54 may contact the second spacer 52, e.g., the lowermost surface of the third spacer 54 may extend directly on the second portion (i.e., horizontal portion) of the second spacer 52.

The fourth spacer 56 may, e.g., directly and continuously, cover the third spacer 54. An uppermost end of the fourth spacer 56 may be disposed at the same level as the upper surface of the gate capping layer 40, e.g., relative to the bottom surface of the substrate 10, and a lower end, e.g., a lower surface, of the fourth spacer 56 may, e.g., directly, contact the third spacer 54.

The etch stop layer 60 may be conformally disposed along an upper surface of a portion of the substrate 10, the side surface of the semiconductor layer 12, the side surface of the spacer SP, and an upper surface of the gate structure GS. A lower surface of the etch stop layer 60 may contact the upper surface of the substrate 10, and may be coplanar with a lower surface of the semiconductor layer 12. The etch stop layer 60 may include, e.g., silicon nitride. The interlayer insulating layer 70 may cover the etch stop layer 60, and may include, e.g., silicon oxide.

Referring again to FIG. 1, the source/drain contact 80 may be disposed adjacent to the gate structure GS, and may be electrically connected to the source/drain region SD. For example, the source/drain contact 80 may contact the source/drain region SD while vertically extending through the interlayer insulating layer 70 and the etch stop layer 60.

FIGS. 3 to 9 are vertical cross-sectional views illustrating stages in a method of manufacturing a semiconductor device according to an exemplary embodiment.

Figure 3:
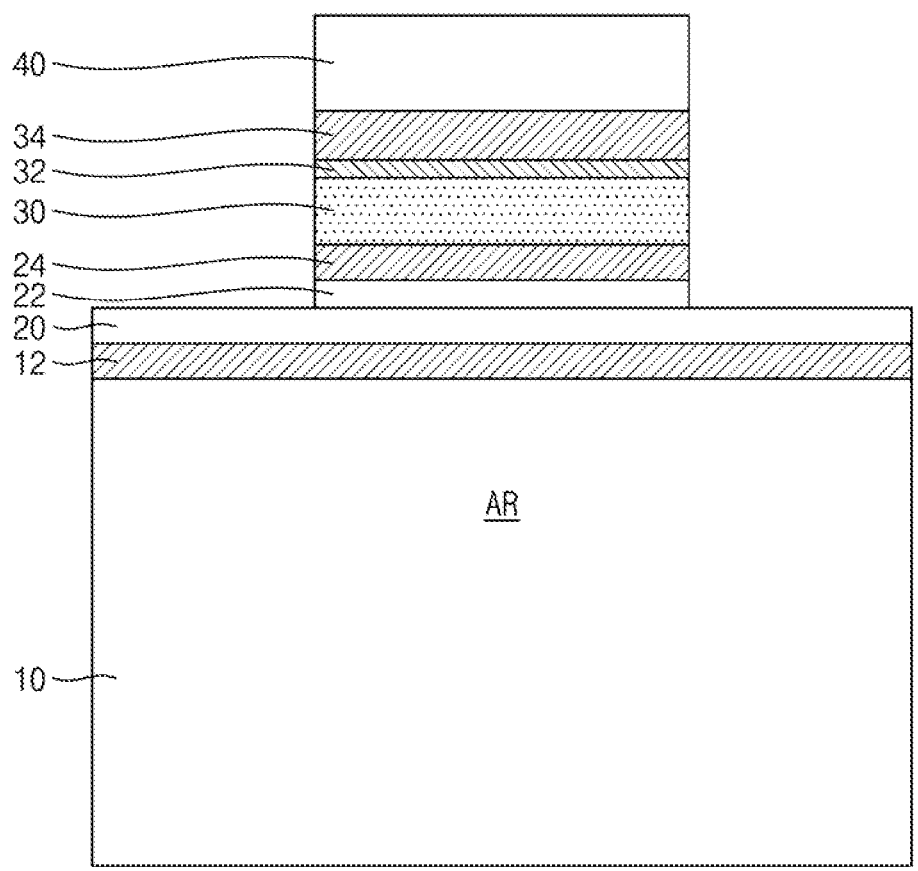
FIGS. 3 to 9 are vertical cross-sectional views illustrating stages in a method of manufacturing a semiconductor device according to an exemplary embodiment.

Referring to FIG. 3, the first dielectric layer 20, the second dielectric layer 22, the work function control layer 24, the first gate conductive layer 30, the second gate conductive layer 32, the third gate conductive layer 34, and the gate capping layer 40 may be formed on the substrate 10. The substrate 10 may include a semiconductor material. For example, the substrate 10 may be a silicon substrate, a germanium substrate, a silicon germanium substrate, or a silicon-on-insulator (SOI) substrate.

The substrate 10 may include the active region AR. For example, a plurality of active regions AR having bar shapes, e.g., linear structures having a shorter axis and a longer axis, spaced apart from each other may be defined on the substrate 10. The active region AR may include a group III element or a group V element. For example, when an NMOS transistor is to be formed, the active region AR may be P type, and may include at least one of boron (B), aluminum (Al), gallium (Ga), indium (In), and thallium (Tl), which are group III elements. On the other hand, when a PMOS transistor is to be formed, the active region AR may be N type, and may include at least one of nitrogen (N), phosphorous (P), arsenic (As), antimony (Sb), and bismuth (Bi), which are group V elements.

The semiconductor layer 12 may be formed on the substrate 10, and may include a material capable of enhancing carrier mobility. For example, the semiconductor layer 12 may be an SiGe layer. In some embodiments, the semiconductor layer 12 may be selective, and may be omitted.

The first dielectric layer 20, the second dielectric layer 22, the work function control layer 24, the first gate conductive layer 30, the second gate conductive layer 32, the third gate conductive layer 34, and the gate capping layer 40 may be sequentially stacked on the substrate 10. The first dielectric layer 20 may include a dielectric material and, e.g., may include silicon oxide. The second dielectric layer 22 may include a dielectric material having a higher dielectric constant than the first dielectric layer 20. For example, the second dielectric layer 22 may include $HfO_2$, $ZrO_2$, $Al_2O_3$, $La_2O_3$, $Ta_2O_3$, $TiO_2$, $SrTiO_3$(STO), $BaTiO_3$, or a combination thereof.

The work function control layer 24 may include metal, a conductive metal nitride, a conductive metal carbide, a conductor including metal atoms, or a combination thereof. The metal-containing work function control layer 24 may have a single-layer structure or a multilayer structure. The metal-containing work function control layer 24 may include at least one of, e.g., Ti, Ta, Al, Ni, Co, La, Pd, Nb, Mo, Hf, Ir, Ru, Pt, Yb, Dy, Er, Pd, TiAl, HfSiMo, TiN, WN, TaN, RuN, MoN, TiAlN, TiC, and TaC. In some embodiments, the metal-containing work function control layer 24 may include at least one stack structure of, e.g., TiN/TaN, $Al_2O_3$/TiN, Al/TiN, TiN/Al/TiN, TiN/TiON, Ta/TiN, TaN/TiN, La/TiN, Mg/TiN, and Sr/TiN.

The first gate conductive layer 30 may include a metal, e.g., W, Mo, Au, Cu, Al, Ni and Co or doped polysilicon. In some embodiments, the first gate conductive layer 30 may be a single layer or multiple layers including at least two kinds of materials from the above-indicated materials. Each of the second gate conductive layer 32 and the third gate conductive layer 34 may include, e.g., TiN, TiSiN, W, Mo, Au, Cu, Al, Ni, Co, or a combination thereof. The gate capping layer 40 may include, e.g., silicon nitride.

After formation of the first dielectric layer 20, the second dielectric layer 22, the work function control layer 24, the first gate conductive layer 30, the second gate conductive layer 32, the third gate conductive layer 34, and the gate capping layer 40, the second dielectric layer 22, the work function control layer 24, the first gate conductive layer 30, the second gate conductive layer 32, the third gate conductive layer 34, and the gate capping layer 40 may be patterned to have a smaller horizontal width than the semiconductor layer 12. The first dielectric layer 20 may not be removed by the patterning, and may cover the semiconductor layer 12.

Figure 4:
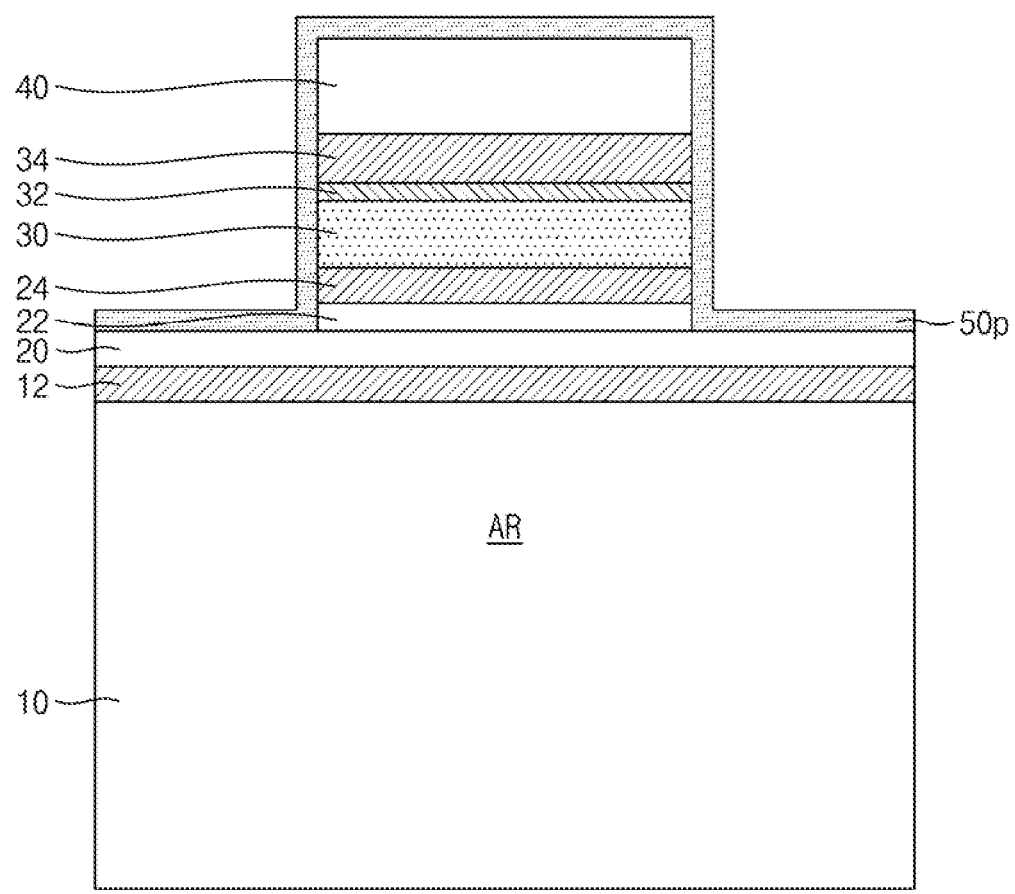

Referring to FIG. 4, a first spacer material layer 50p may be formed to cover the resultant structure of FIG. 3. For example, the first spacer material layer 50p may be conformally formed along an upper surface of the first dielectric layer 20, side surfaces of the second dielectric layer 22, the work function control layer 24, the first gate conductive layer 30, the second gate conductive layer 32, the third gate conductive layer 34, and the gate capping layer 40, and an upper surface of the gate capping layer 40. The first spacer material layer 50p may include silicon nitride.

Figure 5:
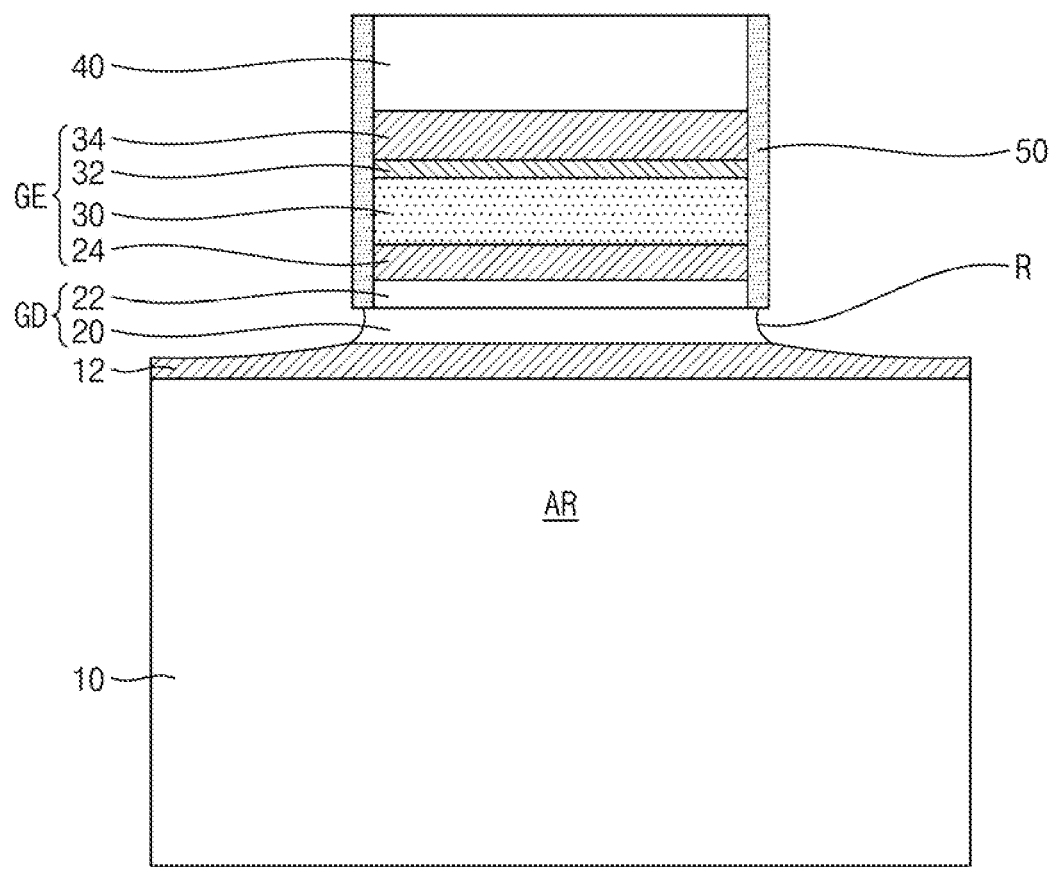

Referring to FIG. 5, the first spacer material layer 50p may be etched by an anisotropic etching process, thereby forming the first spacer 50. A portion of the first dielectric layer 20 may be removed during the etching process and, as such, an upper surface of the semiconductor layer 12 may be partially exposed. In addition, a portion of the semiconductor layer 12 not covered by the first dielectric layer 20 may be etched by the etching process. For example, the thickness of the portion of the semiconductor layer 12 not covered by the first dielectric layer 20 may be smaller than the thickness of a portion of the semiconductor layer 12 covered by the first dielectric layer 20, e.g., as measured from the top of the active region AR. In some embodiments, a step may be formed between the portion of the semiconductor layer 12 not covered by the first dielectric layer 20 and the portion of the semiconductor layer 12 covered by the first dielectric layer 20. The etched first dielectric layer 20 may include the recess R, e.g., a side surface of the first dielectric layer 20 may be rounded.

The first spacer 50 may cover the side surfaces of the second dielectric layer 22, the work function control layer 24, the first gate conductive layer 30, the second gate conductive layer 32, the third gate conductive layer 34 and the gate capping layer 40, but may not cover a side surface of the recess R. For example, as illustrated in FIG. 5, the first spacer 50 may have a linear shape, in a vertical cross-section. For example, as illustrated in FIG. 5, the first spacer 50 may cover an edge of the upper surface of the first dielectric layer 20, and may overhang the recess R.

The etched first dielectric layer 20 and the second dielectric layer 22 may constitute the gate dielectric layer GD. The work function control layer 24, the first gate conductive layer 30, the second gate conductive layer 32, and the third gate conductive layer 34 may constitute the gate electrode structure GE.

Figure 6:
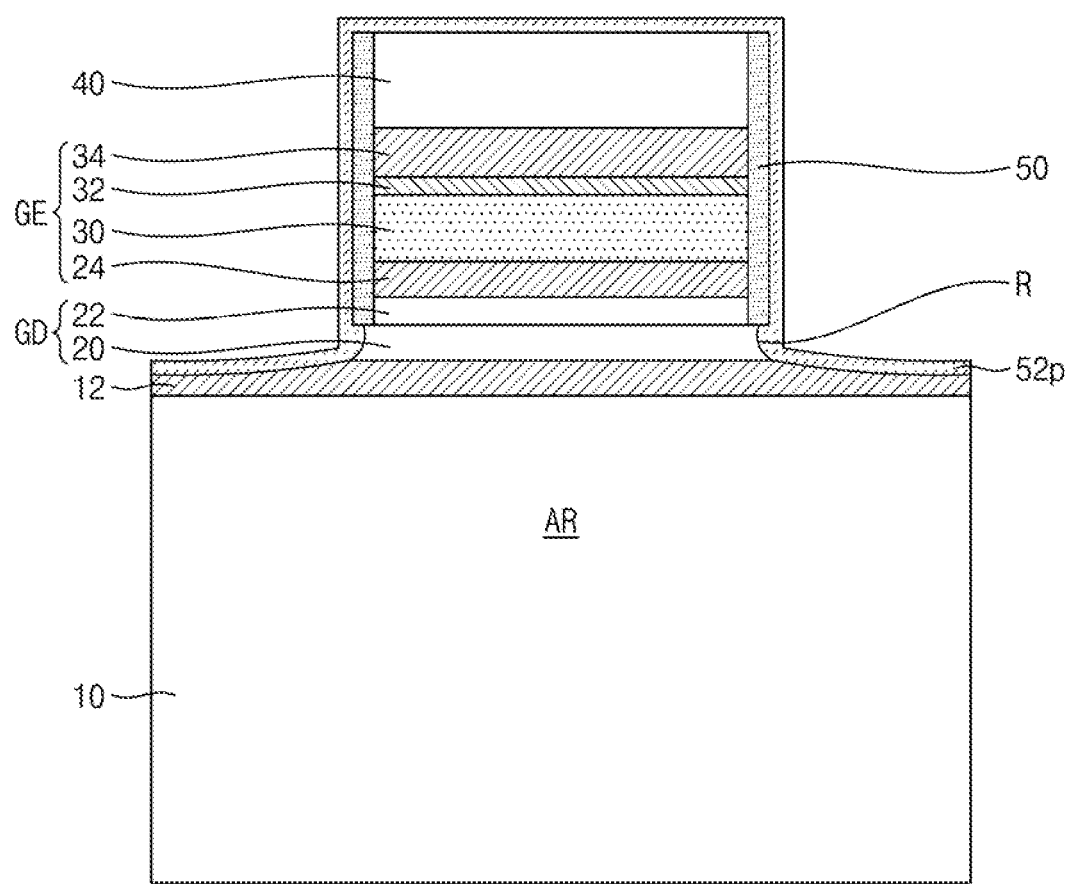

Referring to FIG. 6, a second spacer material layer 52p may be formed to cover the resultant structure of FIG. 5. For example, the second spacer material layer 52p may be conformally formed along the upper surface of the semiconductor layer 12, the side surface of the first dielectric layer 20, a side surface of the first spacer 50, and the upper surface of the gate capping layer 40. The second spacer material layer 52p may include silicon nitride.

Figure 7:
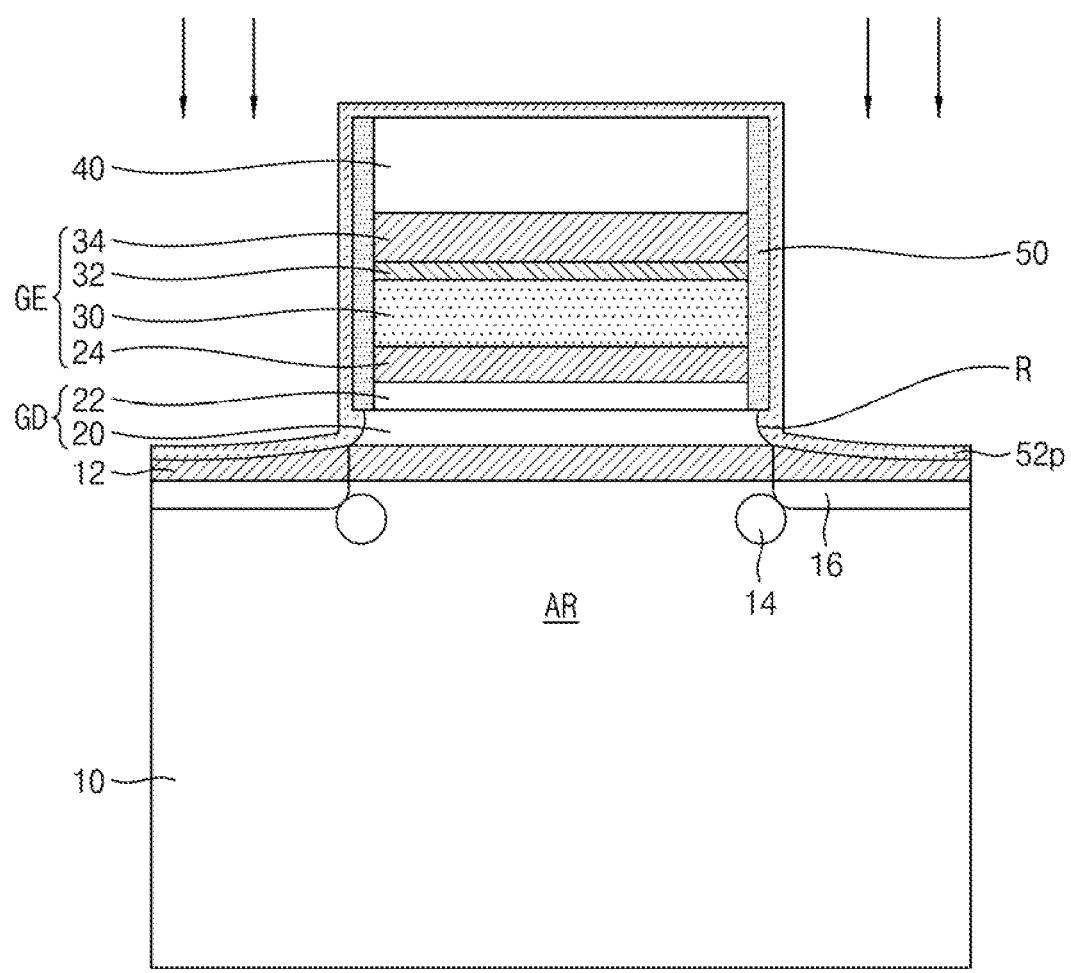

Referring to FIG. 7, an ion implantation process may be performed on the resultant structure of FIG. 6, and, as such, the LDD region 16 and the halo region 14 may be formed at an upper portion of the substrate 10. The LDD region 16 may include an impurity having a conductivity type different from that of the active region AR. For example, when the active region AR is P type, the LDD region 16 may be N type, and may include at least one of nitrogen (N), phosphorous (P), arsenic (As), antimony (Sb), and bismuth (Bi), which are group V elements. The halo region 14 may include an impurity having the same conductivity type as the active region AR. For example, when the active region AR is P type, the halo region 14 may be P type, and may include at least one of boron (B), aluminum (Al), gallium (Ga), indium (In), and thallium (Tl), which are group III elements. The LDD region 16 and the halo region 14 may be disposed adjacent to each other. For example, the LDD region 16 may be formed at an upper portion of the active region AR, and the halo region 14 may be formed to contact a lower portion of the LDD region 16.

As shown in FIGS. 6 and 7, the ion implantation process may be performed after the second spacer material layer 52p is formed to cover the side surface of the first dielectric layer 20. Accordingly, the first dielectric layer 20 may not be influenced or may be substantially less influenced by the ion implantation process, thereby preventing degradation of electrical characteristics of a gate insulating layer, e.g., time-dependent dielectric breakdown (TDDB). That is, it may be possible to enhance reliability of the resultant device.

Figure 8:
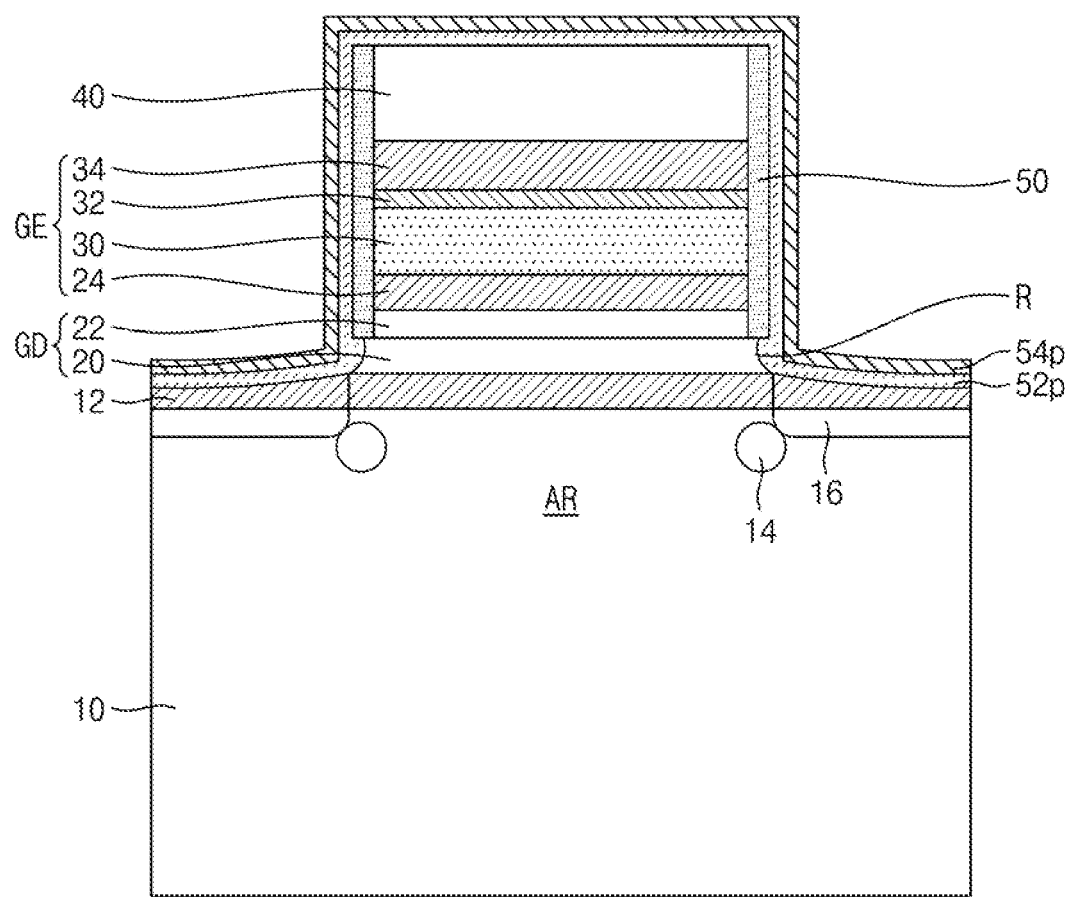

Referring to FIG. 8, a third spacer material layer 54p may be formed to cover the resultant structure of FIG. 7. For example, the third spacer material layer 54p may be conformally formed on the second spacer material layer 52p. The third spacer material layer 54p may include silicon nitride. The third spacer material layer 54p may serve to supplement the thickness of the second spacer material layer 52p.

Figure 9:
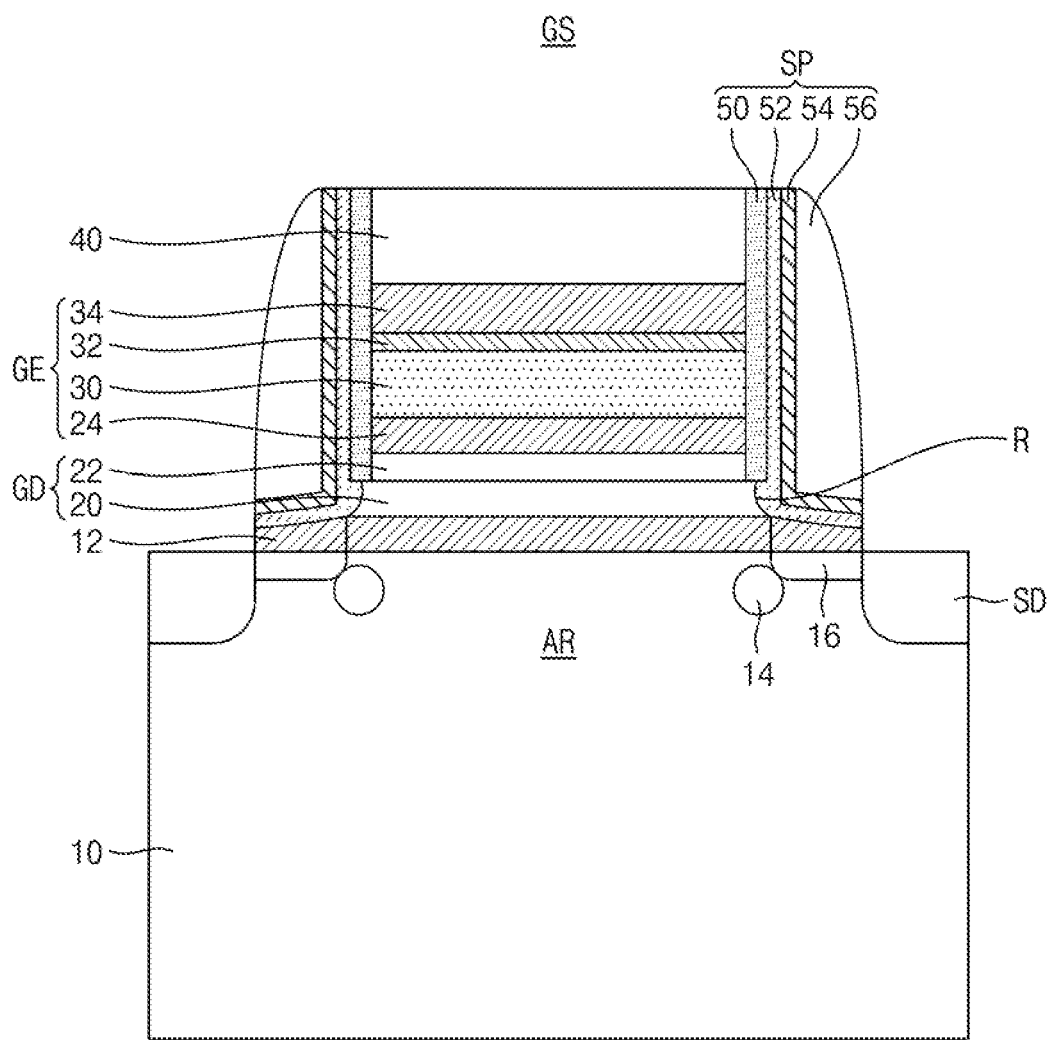

Referring to FIG. 9, the fourth spacer 56 may be formed on the third spacer material layer 54p. The fourth spacer 56 may be formed by forming an insulating material to cover the resultant structure of FIG. 8, and then anisotropically etching the insulating material. The fourth spacer 56 may include silicon oxide. The spacer material layer 52p and the third spacer material layer 54p may be etched by an etching process, thereby forming the second spacer 52 and the third spacer 54. In addition, a portion of the semiconductor layer 12 not covered by the fourth spacer 56 may be removed by the etching process and, as such, the upper surface of the substrate 10 may be exposed. The third spacer 54 may prevent oxygen atoms included in the fourth spacer 56 from entering the first dielectric layer 20, thereby preventing degradation of the first dielectric layer 20.

The first spacer 50, the second spacer 52, the third spacer 54, and the fourth spacer 56 may constitute the spacer structure SP covering side surfaces of the gate dielectric layer GD and the gate electrode structure GE. In detail, the first spacer 50 may cover the side surfaces of the first dielectric layer 20, the gate electrode structure GE, and the gate capping layer 40, and may have a line shape extending in a vertical direction. The second spacer 52 may cover the first spacer 50, the recess R of the first dielectric layer 20, and the upper surface of the semiconductor layer 12, and may have an L shape. The third spacer 54 may cover the second spacer 52, and may have an L shape. The fourth spacer 56 may cover the third spacer 54. A side surface of the spacer structure SP may be coplanar with a side surface of the semiconductor layer 12. The gate dielectric layer GD, the gate electrode structure GE, the gate capping layer 40, and the spacer structure SP may constitute the gate structure GS.

The upper surface of the substrate 10 and the upper surface of the gate capping layer 40 may be exposed by the etching process. The upper surface of the gate capping layer 40 may be coplanar with upper surfaces of the first spacer 50, the second spacer 52, and the third spacer 54.

In addition, the source/drain region SD may be formed at the upper portion of the substrate 10 by an ion implantation process. The source/drain region SD may have the same conductivity type as the LDD region 16, and may have a higher ion concentration than the LDD region 16. Although the source/drain region SD is shown as being formed outside the LDD region 16 and as being formed to be deeper than the LDD region 16, the exemplary embodiments of the disclosure are not limited thereto.

Again referring to FIG. 1, the etch stop layer 60, the interlayer insulating layer 70, and the source/drain contact 80 may be formed. The etch stop layer 60 may be formed to cover the resultant structure of FIG. 9. For example, the etch stop layer 60 may be conformally formed along the semiconductor layer 12, the spacer structure SP, and the upper surface of the gate capping layer 40. The interlayer insulating layer 70 may be formed by forming an insulating layer to cover the etch stop layer 60, and then planarizing the insulating material such that an upper surface of the etch stop layer 60 is exposed. An upper surface of the interlayer insulating layer 70 may be coplanar with the upper surface of the etch stop layer 60. The etch stop layer 60 may include silicon nitride, and the interlayer insulating layer 70 may include silicon oxide.

The source/drain contact 80 may be formed adjacent to the gate structure GS, and may contact the source/drain region SD. The source/drain contact 80 may be formed by anisotropically etching the interlayer insulating layer 70 and the etch stop layer 60, thereby forming an opening, and then filling the opening with a conductive material. The source/drain contact 80 may include a metal, e.g., at least one of Ti, W, Ni and Co, or a metal nitride, e.g., TiN, TiSiN, TiAlN, TaN, TaSiN, WN, etc.

Figure 10:
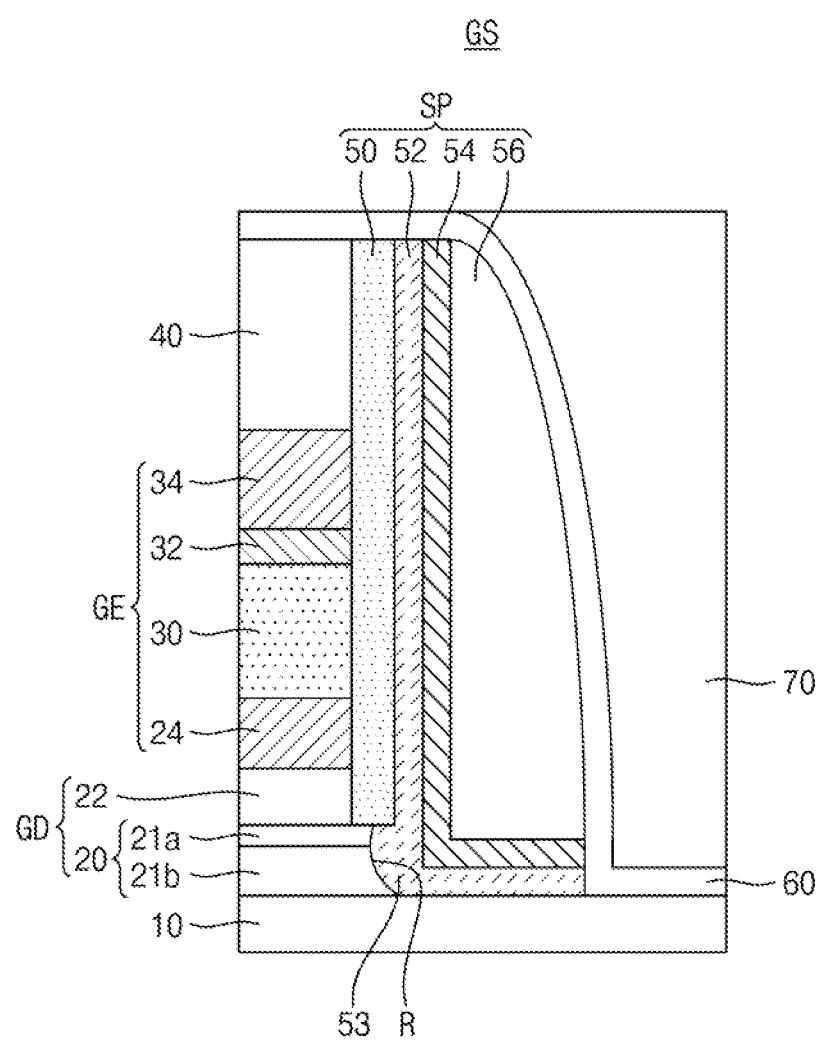
FIGS. 10 and 11 are vertical cross-sectional views of semiconductor devices according to exemplary embodiments.
Figure 11:
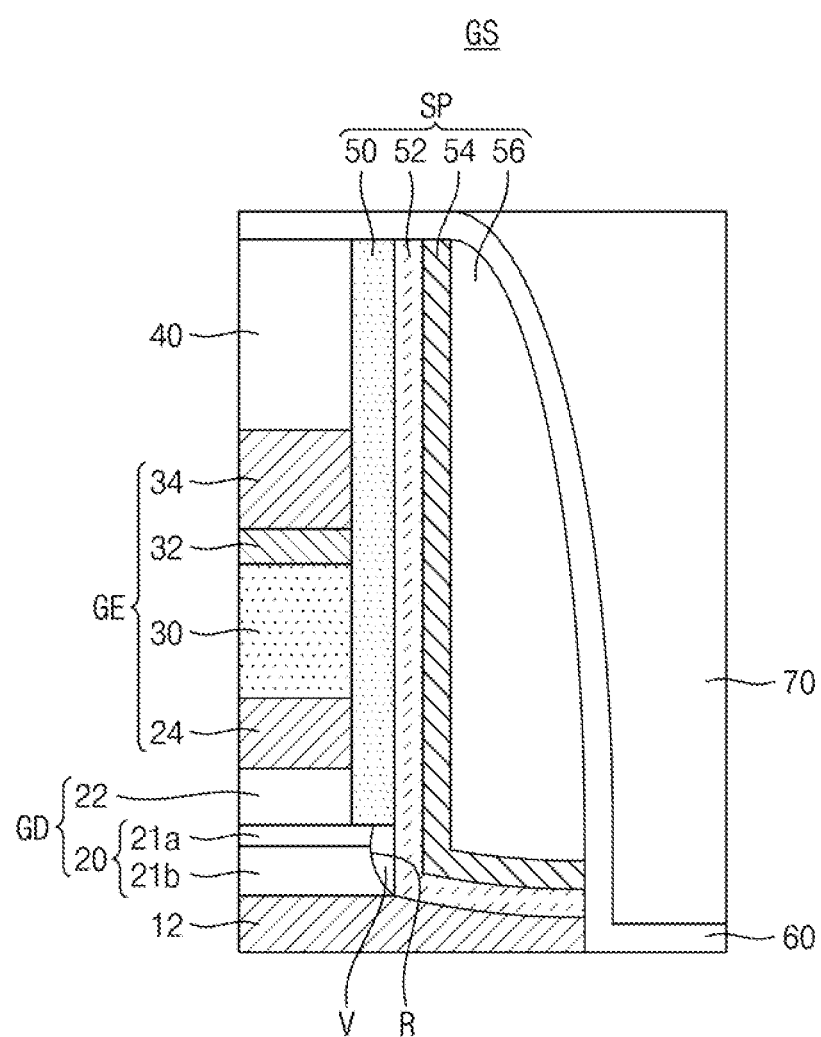

FIGS. 10 and 11 are vertical cross-sectional views of semiconductor devices according to exemplary embodiments.

Referring to FIG. 10, in an embodiment, the semiconductor layer 12 on the substrate 10 may be omitted. For example, the semiconductor layer 12 may not be formed in the process described with reference to FIG. 3, and the first dielectric layer 20 may, e.g., directly, contact an upper surface of the substrate 10. Thereafter, the spacer structure SP may be formed by the process described with reference to FIGS. 6 to 9.

As shown in FIG. 10, the upper surface of the substrate 10 may, e.g., directly, contact a lower surface of the lower dielectric layer 21*b*, a lower surface of the second spacer 52, and a lower surface of the etch stop layer 60. In addition, the lower surface of the second spacer 52 and the lower surface of the etch stop layer 60 may be coplanar with the lower surface of the lower dielectric layer 21*b*.

In some embodiments, a portion of the substrate 10 not covered by the first dielectric layer 20 may be etched in the etching process described with reference to FIG. 5. In this case, the lower surface of the second spacer 52 and the lower surface of the etch stop layer 60 may be disposed at a lower level than the lower surface of the lower dielectric layer 21*b*.

Referring to FIG. 11, a gate structure GS according to an embodiment may be identical to the gate structure GS shown in FIG. 1, except for a different structure of the spacer structure SP. That is, as illustrated in FIG. 1, the second spacer 52 may not contact the recess R of the first dielectric layer 20, e.g., the second spacer 52 may not directly contact the first dielectric layer 20, so a void V may be formed between the first dielectric layer 20 and the second spacer 52. For example, the void V may be defined by the recess R, a lower surface of the first spacer 50, and a side surface of the second spacer 52.

Figure 12:
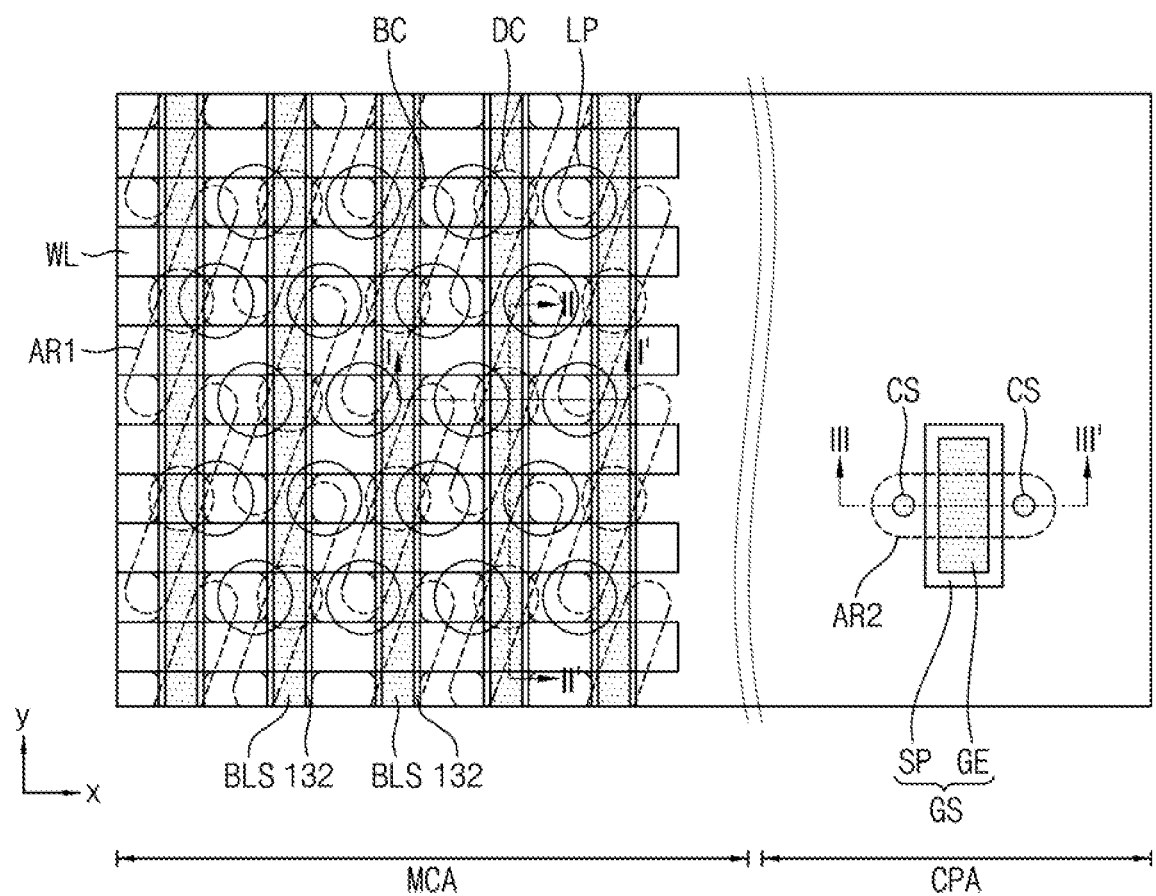
FIG. 12 is a plan view of a semiconductor device according to an exemplary embodiment.
Figure 13:
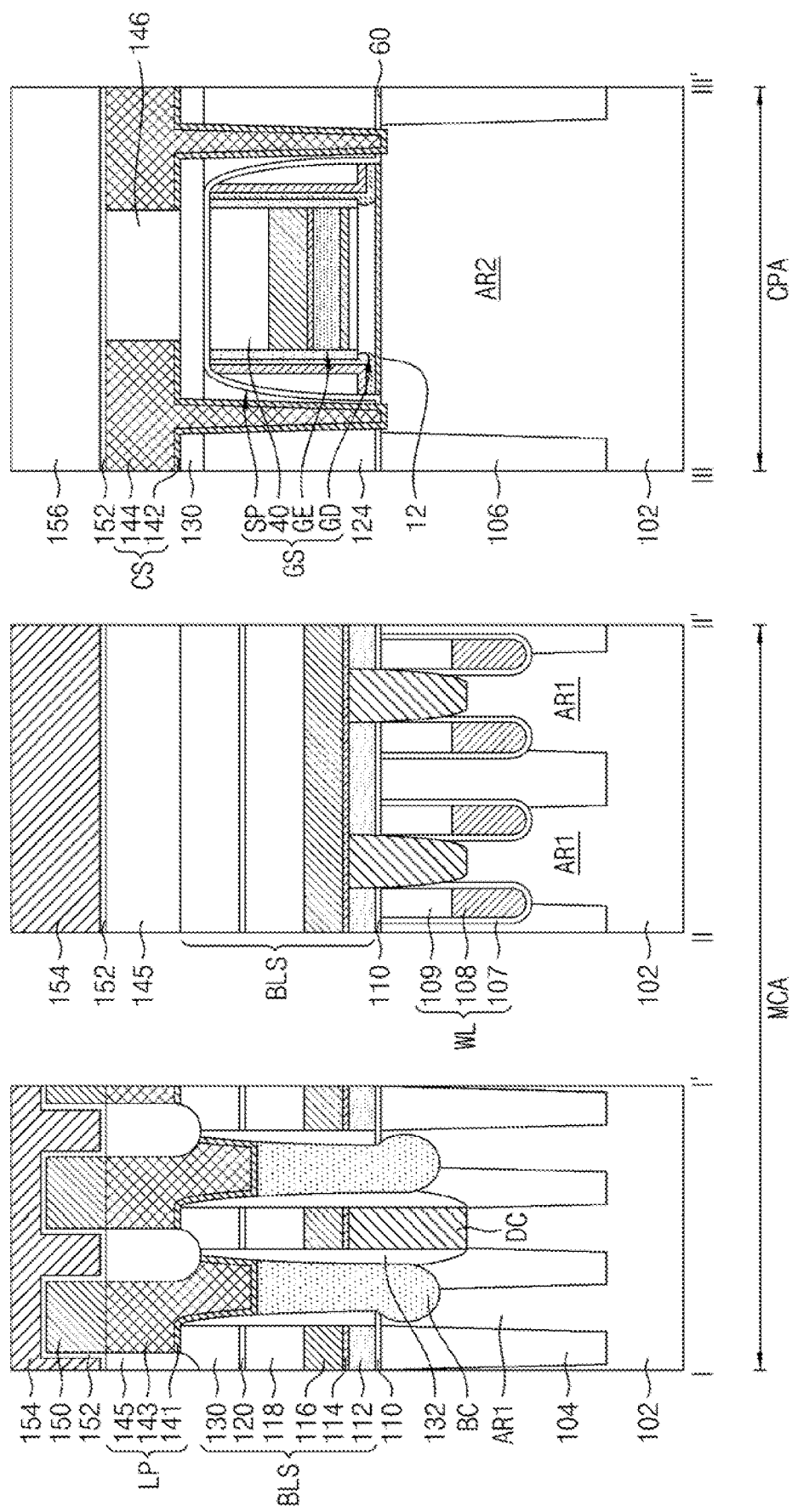
FIG. 13 illustrates vertical cross-sectional views of the semiconductor device shown in FIG. 12, taken along lines I-I', II-II' and III-III' in FIG. 12.

FIG. 12 is a plan view of a semiconductor device according to an exemplary embodiment. FIG. 13 illustrates vertical cross-sectional views of the semiconductor device shown in FIG. 12, taken along lines I-I', II-II' and III-III' in FIG. 12.

Referring to FIGS. 12 and 13, a semiconductor device 100 may include a substrate 102, a word line structure WL, a bit line structure BLS, an insulating spacer 132, a buried contact BC, a landing pad LP, a lower electrode 150, a capacitor dielectric layer 152, and an upper electrode 154 which are disposed in a cell area MCA. The semiconductor device 100 may also include a gate structure GS disposed in a peripheral circuit area CPA.

The substrate 102 may include the cell area MCA and the peripheral circuit area CPA. The cell area MCA may represent an area in which a memory cell of a dynamic random-access memory (DRAM) device is disposed. The peripheral circuit area CPA may be a core/peri area. The substrate 102 may include a semiconductor material. For example, the substrate 102 may be a silicon substrate, a germanium substrate, a silicon germanium substrate, or a silicon-on-insulator (SOI) substrate.

The substrate 102 may include a first active region AR1, a second active region AR2, a first element isolation layer 104, and a second element isolation layer 106. The first element isolation layer 104 may be an insulating layer extending downwardly from an upper surface of the substrate 102, and may define the first active regions AR1 in the cell area MCA. The second element isolation layer 106 may define the second active regions AR2 in the peripheral circuit area CPA.

In a plan view, as illustrated in FIG. 12, the word line structures WL may extend in an x direction, and may be spaced apart from one another in a y direction. In the specification, the x direction and the y direction may be referred to as a first horizontal direction and a second horizontal direction, respectively. In addition, the word line structures WL may cross the first active region AR1. For example, two word line structures WL may intersect one active region AR1. The word line structures WL may be buried in the substrate 102, e.g., the word line structures WL may be disposed within a trench formed in the substrate 102. An upper surface of the word line structure WL may be coplanar with an upper surface of the first element isolation layer 104.

The semiconductor device 100 may further include a buffer layer 110 between the substrate 102 and the bit line structure BLS. The buffer layer 110 may cover upper surfaces of the first active region AR1, the first element isolation layer 104, and the word line structures WL. In an embodiment, the buffer layer 110 may include, e.g., silicon nitride.

In a plan view, the bit line structures BLS may extend in the y direction, and may be spaced apart from one another in the x direction. The bit line structure BLS may have a bar shape extending in the y direction. In a cross-sectional view, the bit line structure BLS may include a first conductive layer 112, a second conductive layer 114, a third conductive layer 116, a first capping layer 118, an etch stop layer 120, and a second capping layer 130 which are sequentially stacked on the buffer layer 110. The first conductive layer 112, the second conductive layer 114, the third conductive layer 116 and the first capping layer 118 may extend in the y direction, and may have substantially the same width in the cross-sectional view.

The first conductive layer 112 may include, e.g., polysilicon, and each of the second conductive layer 114 and the third conductive layer 116 may include, e.g., TiN, TiSiN, W, tungsten silicide, or a combination thereof. The first capping layer 118, the etch stop layer 120, and the second capping layer 130 may each include, e.g., silicon nitride.

The semiconductor device 100 may further include a direct contact DC disposed below the bit line structure BLS in a region in which the bit line structure BLS contacts the first active region AR1. For example, the direct contact DC may fill an interior of a recess formed at the upper surface of the substrate 102. In a plan view, the direct contact DC may contact a central portion of the first active region AR1. An upper surface of the direct contact DC may be disposed at the same level as an upper surface of the first conductive layer 112. The bit line structure BLS may be disposed on direct contacts DC, and the direct contact DC may electrically connect the first active region AR1 to the bit line structure BLS. For example, the direct contact DC may extend through the first conductive layer 112 of the bit line structure BLS, and may be electrically connected to the second conductive layer 114 and the third conductive layer 116. The direct contact DC may include, e.g., polysilicon.

The insulating spacers 132 may be disposed at opposite side surfaces of the bit line structures BLS, respectively, and may extend in the y direction. A part of the insulating spacers 132 may extend into the recess of the substrate 102, and may cover a side surface of the direct contact DC. The insulating spacers 132 may be constituted by a single layer or multiple layers.

The buried contact BC may be disposed among the bit line structures BLS. An upper surface of the buried contact BC may be disposed at a lower level than an upper surface of the second capping layer 130, and a lower portion of the buried contact BC may extend into the substrate 102. For example, a lower end of the buried contact BC may be disposed at a lower level than the upper surface of the substrate 102, and may contact the first active region AR1. The semiconductor device 100 may further include fence insulating layers disposed alternately with the buried contact BC in the y direction in a plan view. The fence insulating layers may overlap with the word line structures WL. The buried contact BC may include, e.g., polysilicon.

The landing pad LP may be disposed on the bit line structure BLS, and may contact the buried contact BC. The landing pad LP may include a first barrier pattern 141 and a first conductive pattern 143. The first barrier pattern 141 may be conformally formed along an upper surface of the bit line structure BLS and the upper surface of the buried contact BC, and the first conductive pattern 143 may be disposed on the first barrier pattern 141. The landing pad LP may be electrically connected to the first active region AR1 via the buried contact BC.

The semiconductor device 100 may further include a first insulating structure 145 disposed among landing pads LP. The first insulating structure 145 may electrically insulate the landing pads LP from one another. An upper surface of the first insulating structure 145 may be coplanar with an upper surface of the landing pad LP.

A capacitor structure of the semiconductor device 100 may be disposed on the landing pad LP in the cell area MCA. The capacitor structure may be constituted by the lower electrode 150, the capacitor dielectric layer 152, and the upper electrode 154. Lower electrodes 150 may be disposed to contact corresponding ones of the landing pads LP, respectively, and the capacitor dielectric layer 152 may be conformally disposed along the first insulating structure 145 and the lower electrode 150. The upper electrode 154 may be disposed on the capacitor dielectric layer 152.

The gate structure GS, the interlayer insulating layer 70, and a contact structure CS, which are disposed in the peripheral circuit area CPA, may be identical or similar to the gate structure GS, the interlayer insulating layer 70, and the source/drain contact 80 shown in FIGS. 1 and 2, and, as such, no description thereof will be given. That is, the gate structure GS described with reference to FIGS. 1 and 2 may be a transistor element disposed in the peripheral circuit area CPA of the DRAM device in an embodiment.

The semiconductor device 100 may further include the interlayer insulating layer 70. The interlayer insulating layer 70 may be disposed on the etch stop layer 60 in the peripheral circuit area CPA. The interlayer insulating layer 70 may have the same structure and may be formed of the same material as the interlayer insulating layer 70 shown in FIG. 1. The second capping layer 130 may be disposed on the interlayer insulating layer 70 and the gate structure GS.

The semiconductor device 100 may further include a second insulating structure 146 and an upper insulating layer 156 disposed among the contact structures CS. The second insulating structure 146 may electrically insulate the contact structures CS. The capacitor dielectric layer 152 may be disposed on the second insulating structure 146, and the upper insulating layer 156 may be disposed on the capacitor dielectric layer 152.

FIGS. 14 to 19 are vertical cross-sectional views illustrating stages in a method of manufacturing a semiconductor device according to an exemplary embodiment.

Figure 14:
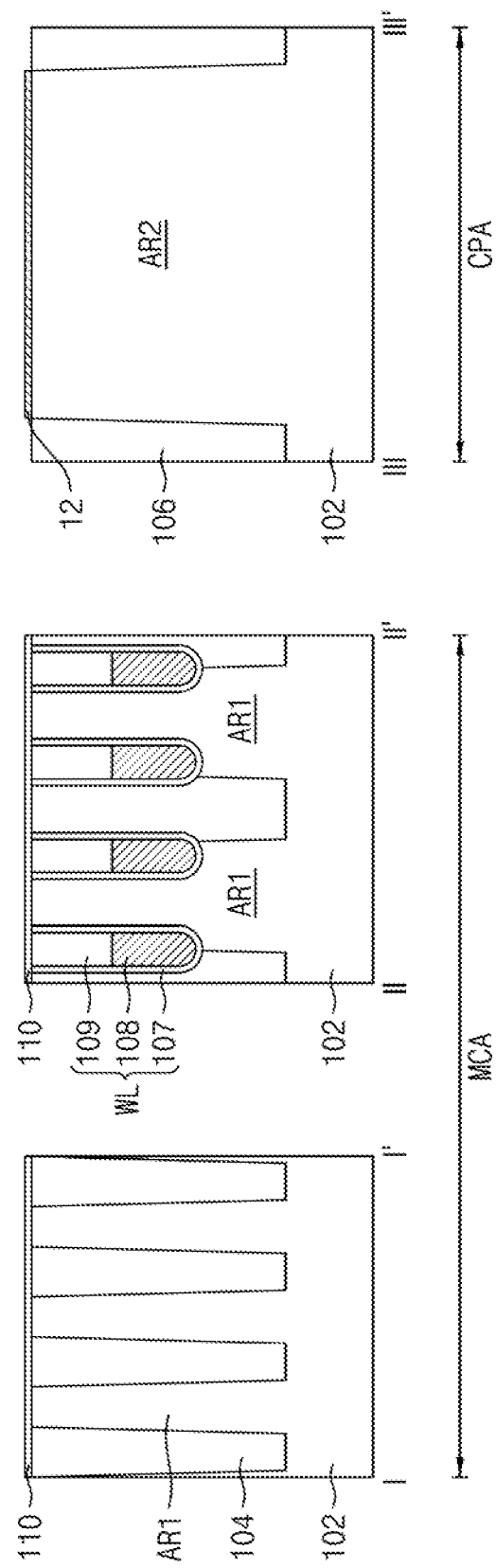
FIGS. 14 to 19 are vertical cross-sectional views illustrating in process order of stages in a method of manufacturing a semiconductor device according to an exemplary embodiment.

Referring to FIG. 14, the first element isolation layer 104 and the second element isolation layer 106 may be formed on the substrate 102. The substrate 102 may include the cell area MCA and the peripheral circuit area CPA. The first and second element isolation layers 104 and 106 may be disposed in the cell area MCA and the peripheral circuit area CPA, respectively.

The first element isolation layer 104 may be formed by forming a trench at an upper surface of the substrate 102, and filling the trench with an insulating material. The first active regions AR1 may be defined by the first element isolation layer 104 in the cell area MCA, and the second active regions AR2 may be defined by the second element isolation layer 106 in the peripheral circuit area CPA. For example, the first active regions AR1 and the second active regions AR2 may correspond to portions of the upper surface of the substrate 102 surrounded by the first and second element isolation layers 104 and 106, respectively. In a plan view, the first active regions AR1 may have a bar shape having a shorter axis and a longer axis, and may be spaced apart from one another. The first and second element isolation layers 104 and 106 may include, e.g., silicon oxide, silicon nitride, silicon oxynitride, or a combination thereof. The first and second element isolation layers 104 and 106 may be constituted by a single layer or a plurality of layers.

The word line structures WL may be formed to cross the first active regions AR1 in the cell area MCA. For example, the word line structures WL may be formed by forming, at the upper surface of the substrate 102, trenches extending in an x direction, and then forming an insulating material and a conductive material within the trenches. The word line structures WL may be spaced apart from one another in a y direction. The word line structure WL may include a dielectric layer 107 covering an inner wall of the trench, a conductive layer 108 filling a lower portion of the trench, and a capping layer 109 filling an upper portion of the trench. The dielectric layer 107 may include, e.g., silicon oxide, silicon nitride, silicon oxynitride, high-k dielectrics, or a combination thereof. The conductive layer 108 may include, e.g., Ti, TiN, Ta, TaN, W, WN, TiSiN, WSiN, or a combination thereof. The capping layer 109 may include, e.g., silicon oxide, silicon nitride, silicon oxynitride, or a combination thereof.

In an embodiment, a source region and a drain region may be formed after formation of the word line structures WL by implanting impurity ions in portions of the first active region AR1 of the substrate 102 at opposite sides of each word line structure WL, respectively. In another embodiment, the impurity ion implantation process for formation of the source region and the drain region may be performed before formation of the word line structures WL. In addition, the impurity ion implantation process may also be performed for the second active region AR2.

Thereafter, the buffer layer 110 covering the first active region AR1, the first element isolation layer 104, and the word line structures WL may be formed in the cell area MCA. The semiconductor layer 12 covering the second active region AR2 may be formed in the peripheral circuit area CPA.

The buffer layer 110 may be formed by depositing an insulating layer, e.g., using a chemical vapor deposition (CVD) or an atomic layer deposition (ALD), and may include, e.g., silicon oxide, silicon nitride, silicon oxynitride, high-k dielectrics, or a combination thereof. The semiconductor layer 12 may be formed by forming a mask layer, such that only the second active region AR2 is exposed, and then performing an epitaxial growth process from a surface of the second active region AR2.

Figure 15:
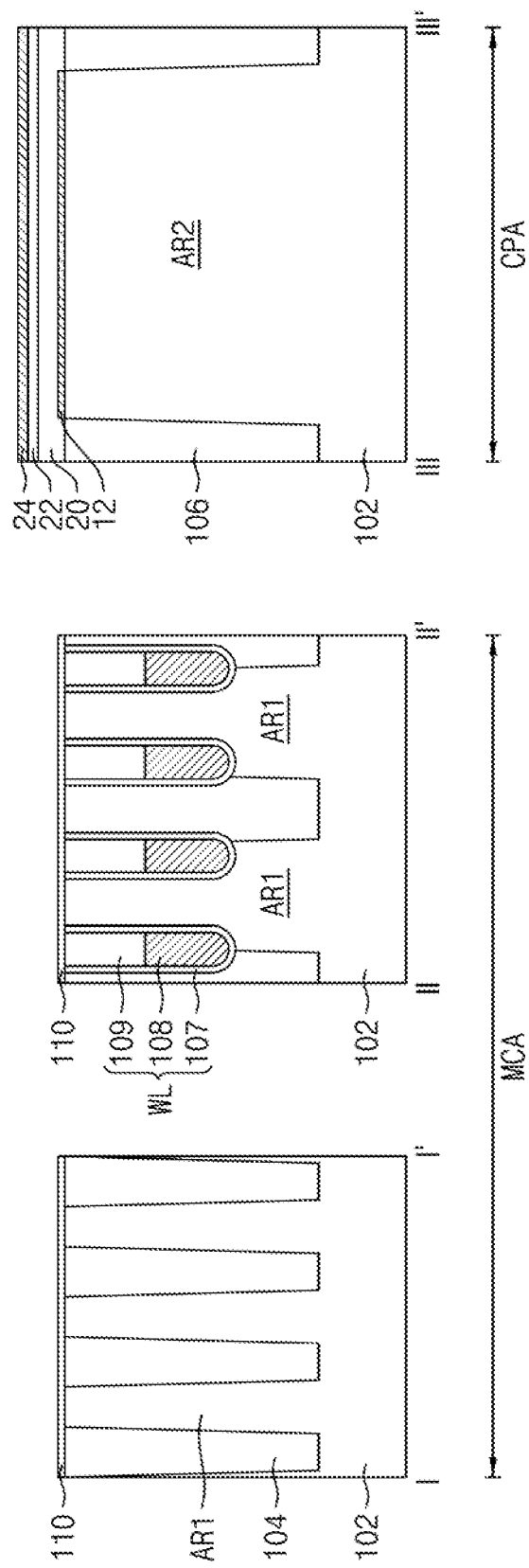

Referring to FIG. 15, the first dielectric layer 20, the second dielectric layer 22, and the work function control layer 24 may be formed in the peripheral circuit area CPA. This formation process may be performed similarly to the process described with reference to FIG. 3.

Figure 16:
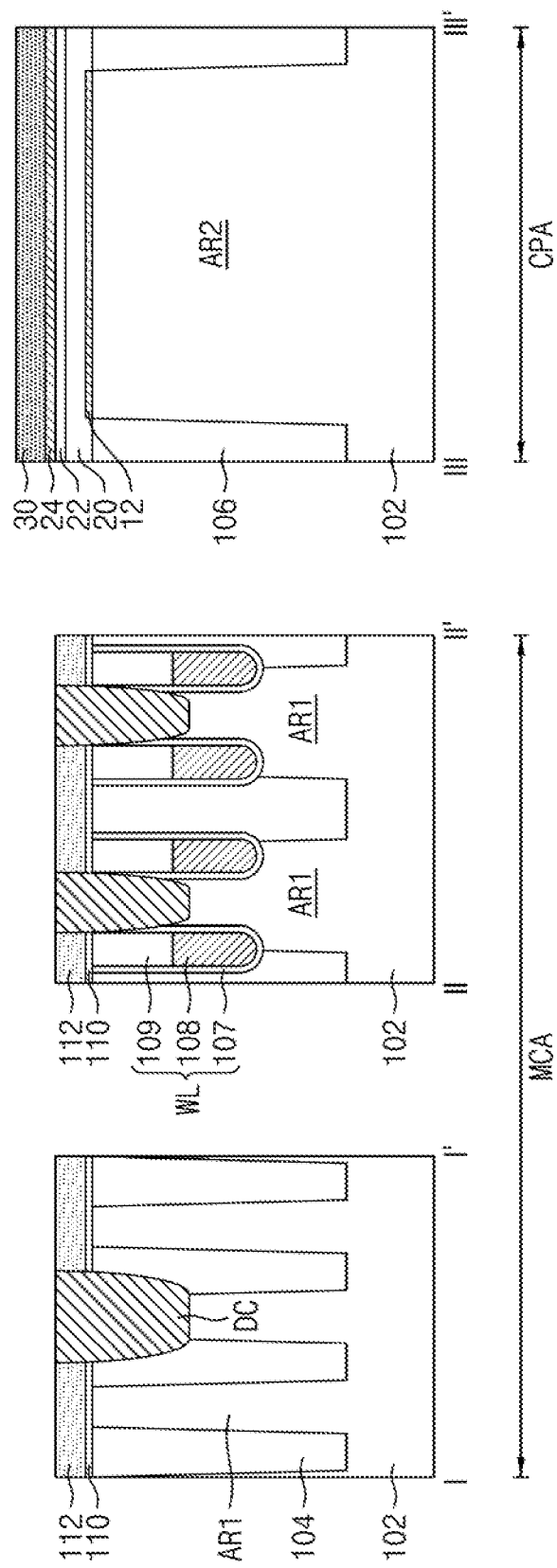

Referring to FIG. 16, the first conductive layer 112 and the direct contact DC may be formed in the cell area MCA, and the first gate conductive layer 30 may be formed in the peripheral circuit area CPA. The first conductive layer 112 may be formed simultaneously with the first gate conductive layer 30 by depositing a conductive material in the cell area MCA and the peripheral circuit area CPA, and may cover the buffer layer 110. The first conductive layer 112 may include the same material as the first gate conductive layer 30, e.g., may include doped polysilicon. Subsequently, a recess may be formed at the upper surface of the substrate 102 by an anisotropic etching process. A direct contact DC may be formed by filling an interior of the recess with a conductive material, and then performing a planarization process. An upper surface of the direct contact DC may be coplanar with an upper surface of the first conductive layer 112. The direct contact DC may be formed in the first active region AR1, e.g., may contact the source region of the first active region AR1. In addition, the direct contact DC may extend through the buffer layer 110 and the first conductive layer 112, and may fill the recess. For example, the direct contact DC may include Si, Ge, W, WN, Co, Ni, Al, Mo, Ru, Ti, TiN, Ta, TaN, Cu, or a combination thereof. In some embodiments, the direct contact DC may include polysilicon.

Figure 17:
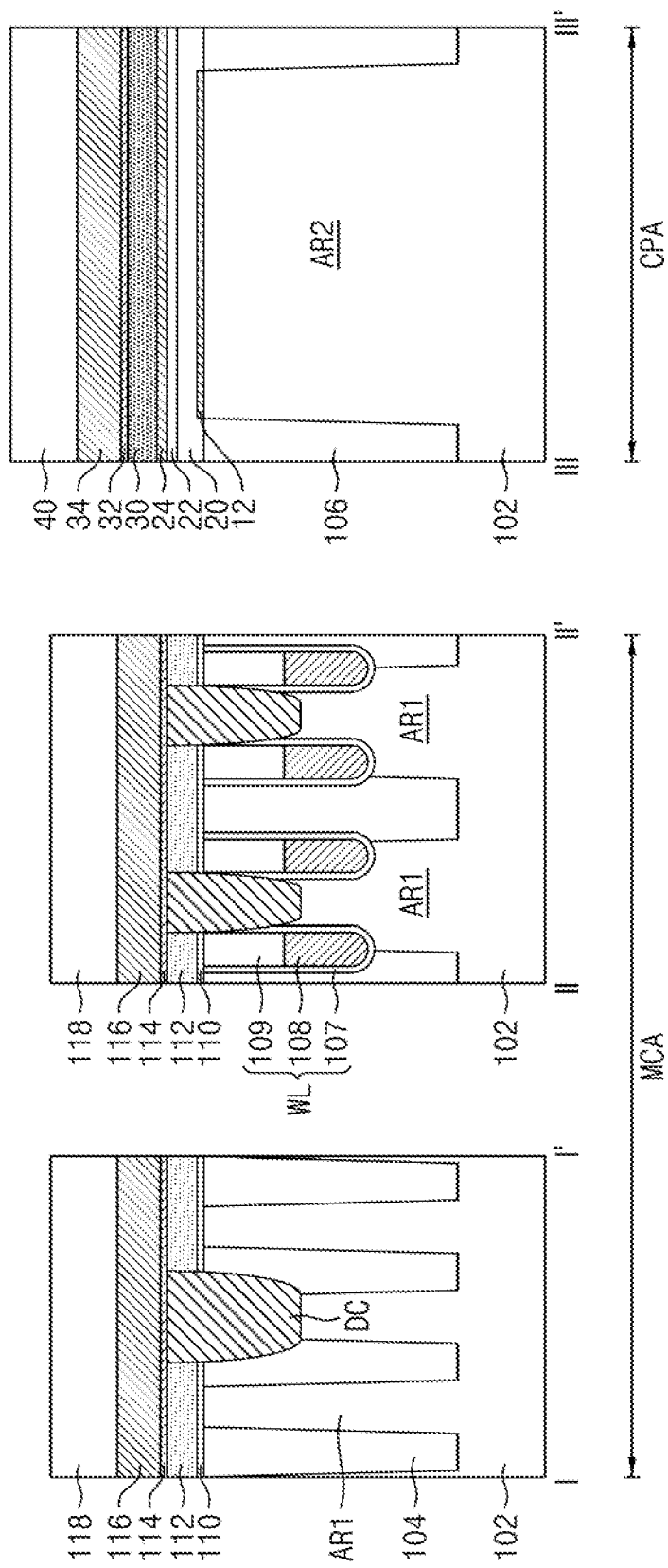

Referring to FIG. 17, the second conductive layer 114, the third conductive layer 116, and the first capping layer 118 may be sequentially stacked on the first conducive layer 112 and the direct contact DC in the cell area MCA, and the second gate conductive layer 32, the third gate conductive layer 34, and the gate capping layer 40 may be sequentially stacked on the first gate conductive layer 30 in the peripheral circuit area CPA. The second conductive layer 114, the third conductive layer 116, and the first capping layer 118 may include the same materials as the second gate conductive layer 32, the third gate conductive layer 34, and the gate capping layer 40, respectively. For example, each of the second conductive layer 114 and the third conductive layer 116 may include TiN, TiSiN, W, tungsten silicide, or a combination thereof. The first capping layer 118 may include, e.g., silicon nitride.

Figure 18:
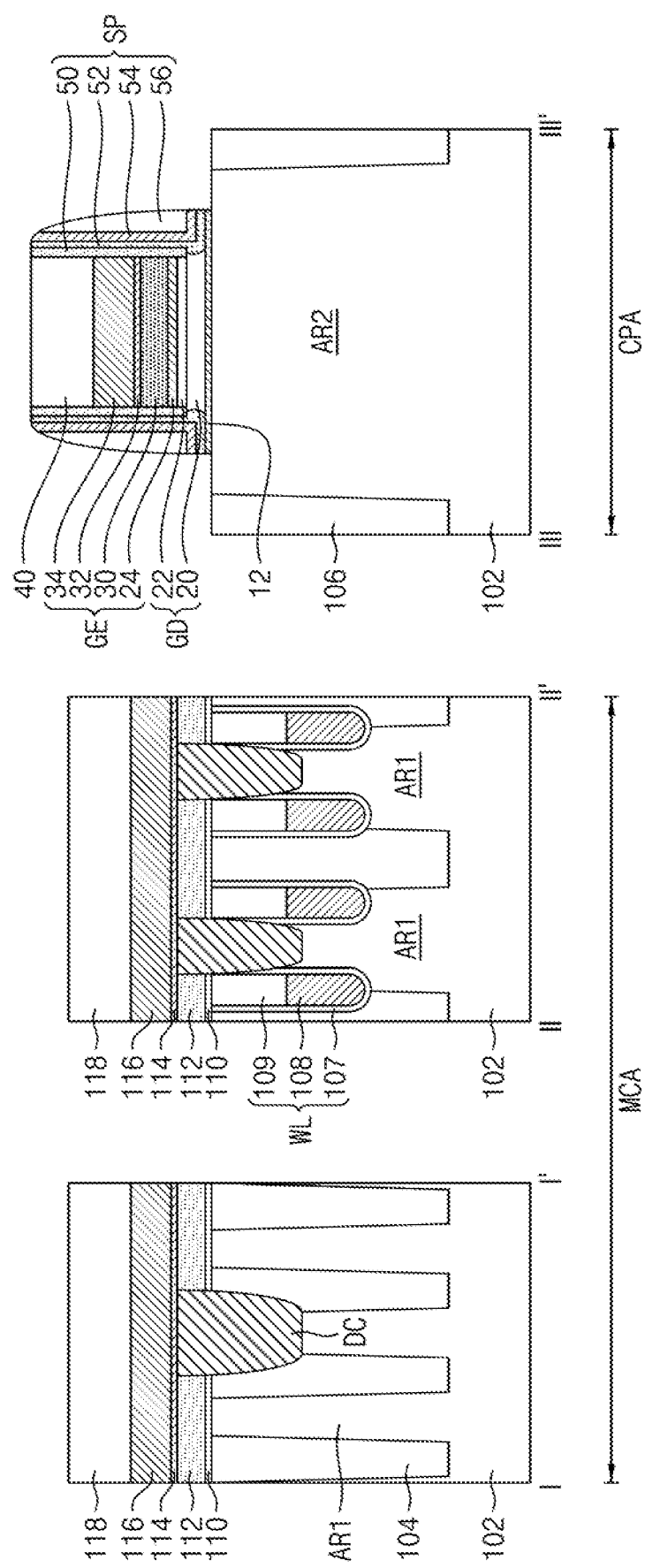

Referring to FIG. 18, the gate structure GS may be formed in the peripheral circuit area CPA. The gate structure GS may be formed by a series of processes described with reference to FIGS. 3 to 9. The gate structure GS may include the gate dielectric layer GD, the gate electrode structure GE, the gate capping layer 40, and the spacer structure SP. The structure and the material of the gate structure GS may be identical to those described with reference to FIGS. 3 to 9. A portion of the semiconductor layer 12 not covered by the gate structure GS may be etched and, as such, an upper surface of the substrate 102 may be exposed. The thickness of a portion of the semiconductor layer 12 not covered by the first dielectric layer 20 may be smaller than the thickness of a portion of the semiconductor layer 12 covered by the first dielectric layer 20 (e.g., ss shown in FIG. 1).

Figure 19:
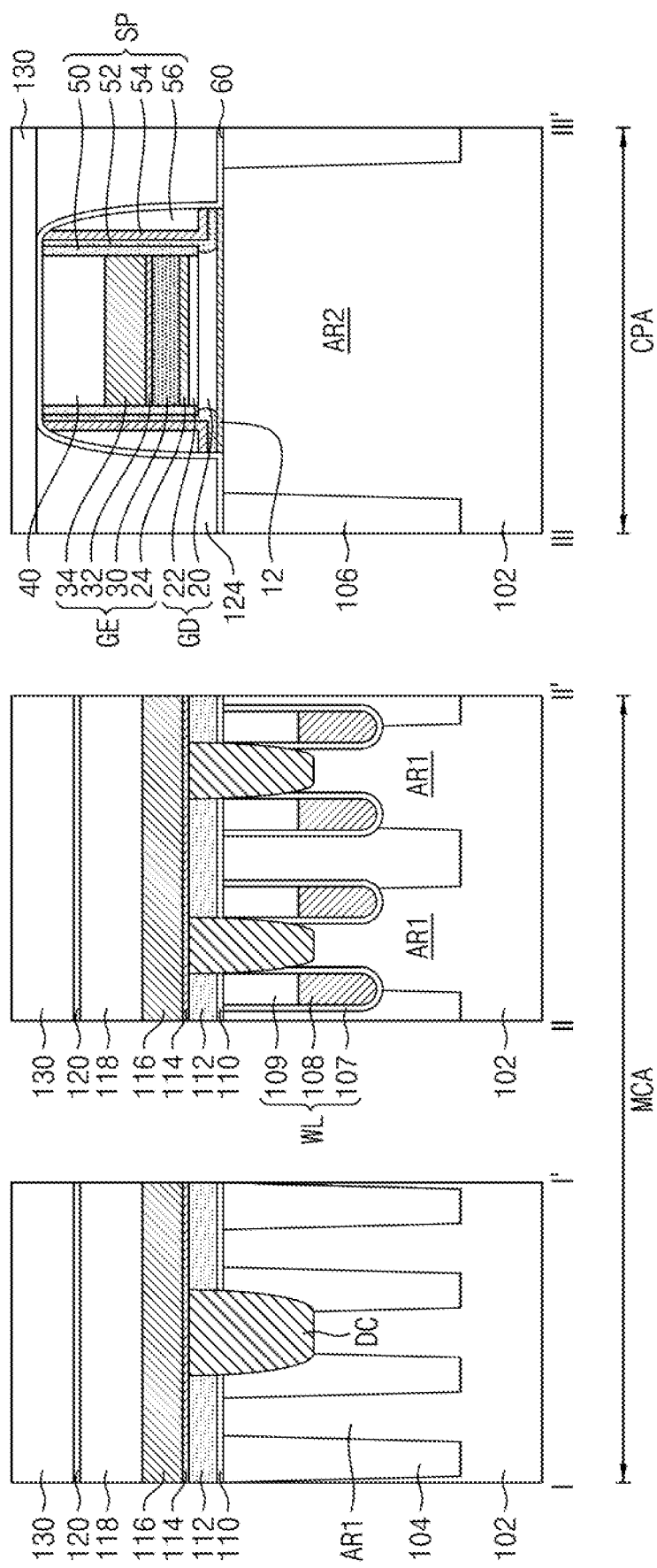

Referring to FIG. 19, the etch stop layer 120 and the second capping layer 130 may be formed in the cell area MCA, and the etch stop layer 60, the interlayer insulating layer 70, and the second capping layer 130 may be formed in the peripheral circuit area CPA. The etch stop layer 120 may cover an upper surface of the first capping layer 118. The etch stop layers 60 and 120 may be formed by conformally depositing an insulating material on the resultant structure of FIG. 18. The insulating material formed in the cell area MCA may be referred to as the etch stop layer 120, and the insulating material formed in the peripheral circuit area CPA may be referred to as the etch stop layer 60. The etch stop layer 60 may cover a portion of the substrate 102, the second element isolation layer 106, and the gate structure GS. The etch stop layers 60 and 120 may include, e.g., silicon nitride.

Thereafter, the interlayer insulating layer 70 may be formed in the peripheral circuit area CPA. The interlayer insulating layer 70 may be formed by forming an insulating material on the etch stop layers 60 and 120, and planarizing the insulating material such that upper surfaces of the etch stop layers 60 and 120 are exposed. The interlayer insulating layer 70 may cover a side surface of the gate structure GS. The second capping layer 130 may be formed by forming an insulating material on the etch stop layers 60 and 120 and the interlayer insulating layer 70, and planarizing the insulating material. The second capping layer 130 may be formed in both the cell area MCA and the peripheral circuit area CPA, and may include silicon nitride.

Again referring to FIG. 13, the buffer layer 110, the first conductive layer 112, the second conductive layer 114, the third conductive layer 116, the first capping layer 118, the etch stop layer 120, and the second capping layer 130 may be etched such that a trench extending in a y direction is formed on the substrate 102 in the cell area MCA, thereby forming the bit line structure BLS. The bit line structure BLS may have a bar shape extending in the y direction.

After formation of the bit line structure BLS, the insulating spacers 132 may be formed at a side surface of the bit line structure BLS. The insulating spacers 132 may be formed by depositing an insulating material covering the bit line structure BLS and an inner wall of the trench, and anisotropically etching the insulating material. The insulating spacers 132 may cover the side surface of the bit line structure BLS, and may also cover a side surface of the direct contact DC. The insulating spacers 132 may be constituted by a single layer or multiple layers, and may include silicon oxide, silicon nitride, silicon oxynitride, or a combination thereof.

After formation of the insulating spacer 132, the buried contacts BC may be formed at the side surface of the bit line structure BLS. The buried contacts BC may be formed by forming a sacrificial layer extending in the y direction while filling the trench of the side surface of the bit line structure BLS, forming fence insulating layers at portions of the sacrificial layer overlapping with the word line structures WL in a vertical direction, removing the sacrificial layer, and then depositing a conductive material at opposite sides of the bit line structures BLS.

After formation of the buried contact BC, an etch-back process for etching an upper portion of the buried contact BC may further be performed. For example, an upper surface of the buried contact BC may be disposed at a lower level than an upper surface of the bit line structure BLS. The buried contact BC may extend into the substrate 102. For example, a lower end of the buried contact BC may be disposed at a lower level than the upper surface of the substrate 102, and may contact the drain region of the first active region AR1. The insulating spacer 132 may be disposed between the buried contact BC and the bit line structure BLS, and may electrically insulate the buried contact BC and the bit line structure BLS from each other. The buried contact BC may include polysilicon.

A hole extending through the interlayer insulating layer 70 and the second capping layer 130 such that the second active region AR2 is exposed may be formed in the peripheral circuit area CPA. The hole may be formed adjacent to the gate structure GS.

Subsequently, the landing pad LP including the first barrier pattern 141 and the first conductive pattern 143 may be formed in the cell area MCA, and the contact structure CS including a second barrier pattern 142 and a second conductive pattern 144 may be formed in the peripheral circuit area CPA. The first insulating structure 145 may be formed among landing pads LP, and the second insulating structure 146 may be formed among the contact structures CS. The first barrier pattern 141 and the first conductive pattern 143 may be formed by depositing a barrier material and a conductive material on the buried contact BC, patterning the barrier material and the conductive material, and then filling with an insulating material.

For example, in the cell area MCA, the first barrier pattern 141 may be formed along the buried contact BC, the insulating spacer 132, and the second capping layer 130, and the first conductive pattern 143 may be deposited on the first barrier pattern 141. The first barrier pattern 141 and the first conductive pattern 143 may constitute the landing pad LP, and the landing pad LP may be electrically connected to the first active region AR1 via the buried contact BC. The first barrier pattern 141 may include a metal silicide, e.g., cobalt silicide, nickel silicide, and/or manganese silicide. The first conductive pattern 143 may include, e.g., polysilicon, metal, metal silicide, a conductive metal nitride, or a combination thereof. In an embodiment, the conductive layer may include tungsten.

The first insulating structure 145 may be disposed between adjacent ones of the landing pads LP, and may electrically insulate the landing pads LP from each other. An upper surface of the first insulating structure 145 and an upper surface of the landing pad LP may be coplanar. The first insulating structure 145 may include, e.g., silicon oxide, silicon nitride, silicon oxynitride, or a combination thereof.

In the peripheral circuit area CPA, the second barrier pattern 142 may be formed along a hole formed by etching the interlayer insulating layer 70 and the second capping layer 130, and the second conductive pattern 144 may be formed on the second barrier pattern 142. The second barrier pattern 142 and the second conductive pattern 144 may be formed simultaneously with the first barrier pattern 141 and the first conductive pattern 143. The second barrier pattern 142 and the conductive pattern 144 may constitute the contact structure CS, and the contact structure CS may contact the second active region AR2. The contact structure CS may have the same structure as the source/drain contact 80 described with reference to FIG. 1, and may be referred to as the source/drain contact 80 in the specification.

The second insulating structure 146 may be disposed between adjacent ones of the contact structures CS, and may electrically insulate the contact structures CS from each other. An upper surface of the second insulating structure 146 and an upper surface of the contact structure CS may be coplanar. The second insulating structure 146 may include, e.g., silicon oxide, silicon nitride, silicon oxynitride, or a combination thereof.

Thereafter, in the cell area MCA, the lower electrode 150 contacting the landing pad LP, the capacitor dielectric layer 152 on the lower electrode 150, and the upper electrode 154 on the capacitor dielectric layer 152 may be formed. The lower electrode 150, the capacitor dielectric layer 152, and the upper electrode 154 may constitute a capacitor structure of the semiconductor device 100.

In an embodiment, the lower electrode 150 may have a pillar shape, without being limited thereto. In another embodiment, the lower electrode 150 may have a cylindrical shape or a hybrid shape of a pillar shape and a cylindrical shape. The lower electrode 150 may include a metal, e.g., Ti, W, Ni and/or Co, or a metal nitride, e.g., TiN, TiSiN, TiAlN, TaN, TaSiN, WN, etc. In an embodiment, the lower electrode 150 may include TiN.

The capacitor dielectric layer 152 may be conformally formed on the first insulating structure 145 and the lower electrode 150. The capacitor dielectric layer 152 may include metal oxide, e.g., $HfO_2$, $ZrO_2$, $Al_2O_3$, $La_2O_3$, $Ta_2O_3$ and/or $TiO_2$, a dielectric material having a perovskite structure, e.g., $SrTiO_3$(STO), $BaTiO_3$, PZT and/or PLZT, or a combination thereof.

The upper electrode 154 may be formed on the capacitor dielectric layer 152. The upper electrode 154 may include a metal, e.g., Ti, W, Ni and/or Co, or a metal nitride, e.g., TiN, TiSiN, TiAlN, TaN, TaSiN, WN, etc.

In the peripheral circuit area CPA, the capacitor dielectric layer 152 may be formed on the contact structure CS and the second insulating structure 146, and an upper insulating layer 156 may be formed on the capacitor dielectric layer 152. The upper insulating layer 156 may include, e.g., silicon oxide, silicon nitride, silicon oxynitride, or a combination thereof.

By way of summation and review, example embodiments provide a semiconductor device capable of enhancing reliability thereof. That is, in accordance with example embodiments, a gate structure may include spacers, e.g., silicon nitride spacers, covering a recess of a gate dielectric layer, e.g., a gate oxide, such that an ion implantation process for formation of LDD/halo regions may be performed after formation of a, e.g., silicon nitride, layer for the, e.g., silicon nitride, spacers, thereby preventing or substantially minimizing damage to the gate dielectric layer during ion implantation. In addition, the layer for the spacers, e.g., the silicon nitride layer, may be formed in double in order to prevent oxygen ions in materials of a multi-spacer from migrating, e.g., diffusing, into the gate dielectric layer. Accordingly, it may be possible to prevent degradation of the gate dielectric layer and to enhance reliability of the resultant device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   a substrate;
   a gate dielectric layer on the substrate, the gate dielectric layer including a recess at a side surface of the gate dielectric layer;
   a gate electrode structure on the gate dielectric layer;
   a gate capping layer on the gate electrode structure; and
   a spacer structure on the substrate and covering the side surface of the gate dielectric layer and side surfaces of the gate electrode structure and the gate capping layer, the spacer structure including a first spacer, a second spacer on the first spacer and covering the recess, and a third spacer on the second spacer, the second spacer and the third spacer including silicon nitride.

2. The semiconductor device as claimed in claim 1, wherein the second spacer includes a protrusion protruding toward the gate dielectric layer, the protrusion being below the first spacer and covering the recess.

3. The semiconductor device as claimed in claim 1, wherein the gate dielectric layer includes a first dielectric layer and a second dielectric layer on the first dielectric layer, the recess being at a side surface of the first dielectric layer.

4. The semiconductor device as claimed in claim 3, wherein a horizontal length of the first dielectric layer is greater than a horizontal length of the second dielectric layer.

5. The semiconductor device as claimed in claim 3, wherein the first spacer covers a side surface of the second dielectric layer and the side surfaces of the gate electrode structure and the gate capping layer, the first spacer having a line shape extending in a vertical direction in a cross-sectional view.

6. The semiconductor device as claimed in claim 5, wherein a lower surface of the first spacer is at a same level as an upper surface of the first dielectric layer.

7. The semiconductor device as claimed in claim 1, wherein the second spacer and the third spacer have an L shape in a cross-sectional view.

8. The semiconductor device as claimed in claim 1, wherein a lower surface of the first spacer is at a higher level than a lower surface of the gate dielectric layer.

9. The semiconductor device as claimed in claim 1, wherein the spacer structure further includes a fourth spacer covering the third spacer, the fourth spacer including silicon oxide.

10. The semiconductor device as claimed in claim 1, further comprising a semiconductor layer between the substrate and the gate dielectric layer, the semiconductor layer including SiGe.

11. The semiconductor device as claimed in claim 10, wherein an upper surface of the semiconductor layer partially is in contact with a lower surface of the second spacer.

12. The semiconductor device as claimed in claim 10, wherein a thickness of a portion of the semiconductor layer not covered by the gate dielectric layer is smaller than a thickness of a portion of the semiconductor layer covered by the gate dielectric layer.

13. The semiconductor device as claimed in claim 12, wherein a lower surface of the second spacer is at a lower level than a lower surface of the gate dielectric layer.

14. The semiconductor device as claimed in claim 12, further comprising an etch stop layer covering the gate capping layer, the spacer structure, and a portion of the substrate, a lower surface of the etch stop layer being at a lower level than a lower surface of the gate dielectric layer.

15. The semiconductor device as claimed in claim 1, wherein a side surface of the second spacer is coplanar with a side surface of the first spacer, a void being defined between the second spacer and the recess.

16. A semiconductor device, comprising:
   a substrate including a cell area and a peripheral circuit area, the cell area having a first active region, and the peripheral circuit area having a second active region;
   a word line structure in the cell area of the substrate and extending in a first horizontal direction;
   a bit line structure extending in a second horizontal direction intersecting the first horizontal direction, the bit line structure crossing the word line structure;
   a capacitor structure electrically connected to the first active region, the capacitor structure including a lower electrode, a capacitor dielectric layer on the lower electrode, and an upper electrode on the capacitor dielectric layer; and
   a gate structure on the second active region in the peripheral circuit area, the gate structure including:
      a gate dielectric layer on the substrate, the gate dielectric layer including a recess at a side surface of the gate dielectric layer,
      a gate electrode structure on the gate dielectric layer,
      a gate capping layer on the gate electrode structure, and
      a spacer structure on the substrate and covering the side surface of the gate dielectric layer and side surfaces of the gate electrode structure and the gate capping layer, the spacer structure including a first spacer, a second spacer on the first spacer and covering the recess, and a third spacer on the second spacer, the second spacer and the third spacer including silicon nitride.

17. The semiconductor device as claimed in claim 16, further comprising:
   a buried contact at a side surface of the bit line structure;
   a landing pad on the buried contact and contacting the lower electrode; and
   a first insulating structure at a side surface of the landing pad.

18. The semiconductor device as claimed in claim 16, further comprising:
   an etch stop layer covering the gate structure;
   an interlayer insulating layer covering the etch stop layer; and
   a source/drain contact adjacent to the gate structure, the source/drain contact being in contact with the second active region and extending through the etch stop layer and the interlayer insulating layer.

19. A semiconductor device, comprising:
   a substrate including an active region and a source/drain region;
   a gate dielectric layer including a first dielectric layer on the substrate, and a second dielectric layer on the first dielectric layer, the first dielectric layer including a recess at a side surface of the gate dielectric layer;
   a gate electrode structure on the gate dielectric layer;
   a gate capping layer on the gate electrode structure;
   a spacer structure on the substrate and covering the side surface of the gate dielectric layer and side surfaces of the gate electrode structure and the gate capping layer, the spacer structure including a first spacer, a second spacer covering the first spacer and the recess, a third spacer covering the second spacer, and a fourth spacer covering the third spacer, the second spacer and the third spacer including silicon nitride;

an etch stop layer covering the gate capping layer and the spacer structure;

an interlayer insulating layer covering the etch stop layer; and a source/drain contact contacting the source/drain region and extending through the interlayer insulating layer.

20. The semiconductor device as claimed in claim 19, wherein:

the first spacer covers a side surface of the second dielectric layer and the side surfaces of the gate electrode structure and the gate capping layer, the first spacer having a line shape extending in a vertical direction in a cross-sectional view;

the second spacer is in contact with a side surface of the first spacer and an upper surface of the substrate, the second spacer having an L shape; and the third spacer covers the second spacer, the third spacer having an L shape.

* * * * *